United States Patent
Kuh et al.

(10) Patent No.: US 9,957,617 B2
(45) Date of Patent: May 1, 2018

(54) DEPOSITION SYSTEM FOR FORMING THIN LAYER

(71) Applicants: Bongjin Kuh, Suwon-si (KR); Beom Seok Kim, Seoul (KR); Woocheol Jeong, Seoul (KR); Sunghwi Cho, Gwangju-si (KR); Woosung Ha, Seoul (KR)

(72) Inventors: Bongjin Kuh, Suwon-si (KR); Beom Seok Kim, Seoul (KR); Woocheol Jeong, Seoul (KR); Sunghwi Cho, Gwangju-si (KR); Woosung Ha, Seoul (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 11 days.

(21) Appl. No.: 15/049,851

(22) Filed: Feb. 22, 2016

(65) Prior Publication Data

US 2016/0289835 A1 Oct. 6, 2016

(30) Foreign Application Priority Data

Mar. 30, 2015 (KR) .................. 10-2015-0044349
Jul. 3, 2015 (KR) .................. 10-2015-0095307

(51) Int. Cl.
*C23C 16/48* (2006.01)
*H01L 21/67* (2006.01)

(52) U.S. Cl.
CPC ...... *C23C 16/481* (2013.01); *H01L 21/67115* (2013.01)

(58) Field of Classification Search
None
See application file for complete search history.

(56) References Cited

U.S. PATENT DOCUMENTS 5,792,273 A    8/1998   Ries et al.
5,814,365 A * 9/1998   Mahawili .............. C23C 16/455
                                                                     118/666

(Continued)

FOREIGN PATENT DOCUMENTS

| JP | 2012-140684 A | 7/2012 |
| JP | 5402657 B2 | 1/2014 |
| KR | 10-2010-0046537 | 5/2010 |

*Primary Examiner* — Jethro M Pence
(74) *Attorney, Agent, or Firm* — Harness, Dickey & Pierce

(57) ABSTRACT

A deposition system which is configured to enable improved temperature uniformity of a heated substrate may include a susceptor provided in a chamber to hold a substrate, a reflection housing provided outside the chamber, a heating module including light sources provided in the reflection housing, and a reflection control module provided in the reflection housing between the heat sources and the chamber. The reflection control module may be configured to reflect light, which propagates along a first trajectory from the light sources toward a center region of the substrate, to propagate along a second trajectory toward an edge region of the substrate, thereby providing improved substrate irradiance uniformity and thus improved substrate temperature uniformity. Improved substrate temperature uniformity may result in improved thickness uniformity of layers provided on the substrate in a deposition process.

18 Claims, 23 Drawing Sheets

(56) References Cited

U.S. PATENT DOCUMENTS

| | | | |
|---|---|---|---|
| 5,830,277 A | * | 11/1998 | Johnsgard ............ C23C 16/481 |
| | | | 118/666 |
| 6,476,362 B1 | | 11/2002 | Deacon et al. |
| 8,314,368 B2 | | 11/2012 | Ranish et al. |
| 2006/0165904 A1 | | 7/2006 | Ohara |
| 2011/0052159 A1 | | 3/2011 | Su et al. |
| 2012/0145697 A1 | | 6/2012 | Komatsu et al. |
| 2015/0071623 A1 | | 3/2015 | Ranish |

* cited by examiner

DEPOSITION SYSTEM FOR FORMING THIN LAYER

CROSS-REFERENCE TO RELATED APPLICATIONS

This U.S. non-provisional patent application claims priority under 35 U.S.C. § 119 to Korean Patent Application No. 10-2015-0044349, filed on Mar. 30, 2015, and Korean Patent Application No. 10-2015-0095307, filed on Jul. 3, 2015, in the Korean Intellectual Property Office, the entire contents of which are hereby incorporated by reference.

BACKGROUND OF THE INVENTION

Some embodiments of the inventive concepts relate to a deposition system, and in particular, to a deposition system for forming a single-crystalline thin layer.

In general, semiconductor devices may be manufactured using a plurality of unit processes, including a thin-film deposition process, a diffusion process, a thermal treatment process, a photolithography process, a polishing process, an etching process, an ion implantation process, and a cleaning process. As an example, a thin-film deposition process may be used to form a single-crystalline, poly-crystalline, or amorphous layer on a substrate. The single-crystalline layer has a defect density lower than the poly-crystalline layer and the amorphous layer. The single-crystalline layer may be formed on a substrate through, for example, a high temperature process.

SUMMARY

Some embodiments of the inventive concepts provide a deposition system capable of forming a thin layer with a uniform thickness.

Some embodiments of the inventive concepts provide a deposition system, allowing for a substrate to have a uniform temperature.

Some embodiments of the inventive concepts provide a deposition system capable of controlling a spatial variation in temperature of a substrate.

According to some embodiments of the inventive concepts, a deposition system may include a chamber, a susceptor provided in the chamber to hold a substrate, a reflection housing provided outside the chamber, at least one light source provided in the reflection housing, and a reflection control module provided in the reflection housing between the at least one light source and the chamber and configured to reflect light, which propagates from the at least one light source toward a center region of the substrate, toward an edge region of the substrate.

According to some embodiments of the inventive concepts, a deposition system may include a susceptor configured to hold a substrate, a reflection housing disposed below the susceptor, at least one light source disposed in the reflection housing, and a reflection control module provided in the reflection housing between the at least one light source and the susceptor and configured to reflect light, which propagates from the heat sources toward a center region of the substrate, toward an edge region of the substrate.

According to some embodiments of the inventive concepts, a deposition system may include a susceptor configured to hold a substrate, a reflection housing disposed on the susceptor, heat sources disposed in the reflection housing, and a reflection control module provided in the reflection housing between the heat sources and the susceptor and configured to reflect light, which propagates from the heat sources toward a center region of the substrate, toward an edge region of the substrate.

According to some embodiments of the inventive concepts, a deposition system may include a susceptor configured to hold a substrate, a lower reflection housing disposed below the susceptor, an upper reflection housing disposed on the susceptor, at least one lower light source and at least one upper light source, which are respectively disposed in the lower and upper reflection housings, and a reflection control module including a lower reflection control module and an upper reflection control module. Here, the lower reflection control module may be disposed in the lower reflection housing between the susceptor and the at least one lower light source, the lower reflection control module including at least one reflection control ring, and the upper reflection control module may be disposed in the upper reflection housing between the susceptor and the at least one upper light source, the upper reflection control module including at least one reflection control ring.

According to some embodiments of the inventive concepts, a deposition system may include a chamber, a susceptor provided in the chamber to hold a substrate, at least one lower light source disposed below the chamber and configured to emit bottom light toward the substrate, a lower reflection housing including a first outer reflection ring disposed outside the at least one lower light source and a first inner reflection ring surrounded by the at least one lower light source, at least one upper light source disposed on the chamber and configured to emit top light toward the substrate, and an upper reflection housing including a second outer reflection ring disposed outside the at least one upper light source and a second inner reflection ring surrounded by the at least one upper light source. Here, the second outer reflection ring may be provided on and aligned to the first outer reflection ring.

According to some embodiments of the inventive concepts, an apparatus may include at least one reflection control module which may be configured to be disposed between at least one light source and at least one substrate in a deposition system. The at least one reflection control module may be further configured to reflect light propagating from the at least one light source along a first trajectory, such that the reflected light propagates along a second trajectory. The first trajectory may be incident upon a center region of the substrate. The second trajectory may be incident upon an edge region of the substrate.

BRIEF DESCRIPTION OF THE DRAWINGS

Some embodiments will be more clearly understood from the following brief description taken in conjunction with the accompanying drawings. The accompanying drawings represent some non-limiting, example embodiments as described herein.

Figure 1:
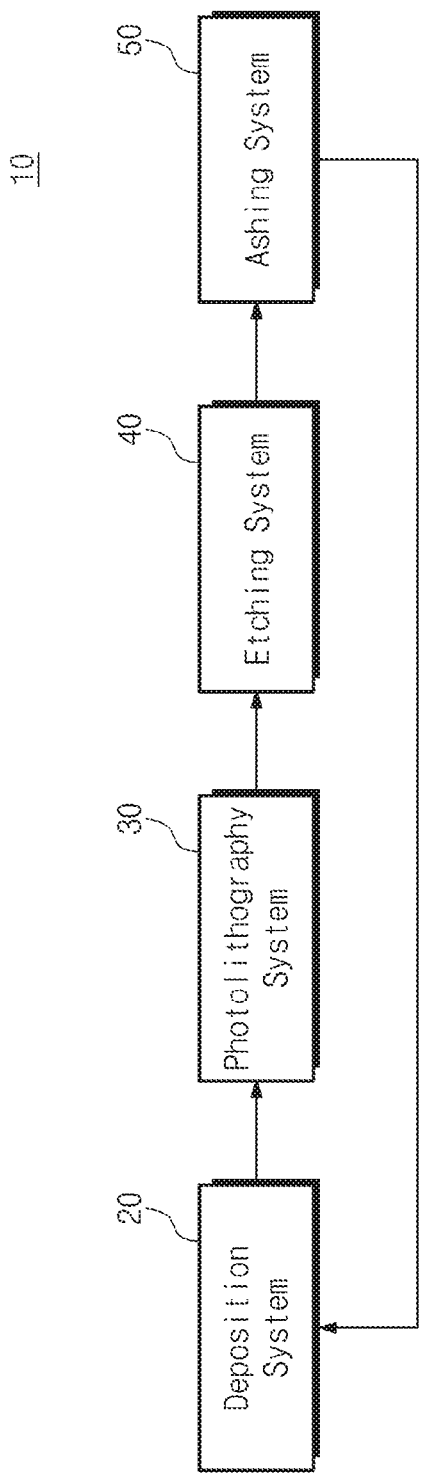
FIG. 1 is a schematic block diagram illustrating a substrate processing system, according to some embodiments of the inventive concepts.

It should be noted that these figures are intended to illustrate the general characteristics of methods, structure and/or materials utilized in some embodiments and to supplement the written description provided below. These drawings are not, however, to scale and may not precisely reflect the precise structural or performance characteristics of any given embodiment, and should not be interpreted as defining or limiting the range of values or properties encompassed by some embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Some embodiments of the inventive concepts will now be described more fully with reference to the accompanying drawings, in which some embodiments are shown. Some embodiments of the inventive concepts may, however, be embodied in many different forms and should not be construed as being limited to the embodiments set forth herein; rather, these embodiments are provided so that this disclosure will be thorough and complete, and will fully convey the inventive concepts to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the inventive concepts.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the inventive concepts. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which some embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a schematic block diagram illustrating a substrate processing system 10, according to some embodiments of the inventive concepts.

Referring to FIG. 1, the substrate processing system 10 may include or be a system for fabricating a semiconductor device and/or a display device or processing a substrate thereof. For example, the substrate processing system 10 may include a deposition system 20, a photolithography system 30, an etching system 40, and an ashing system 50. The deposition system 20 may be configured to perform a process of depositing a thin layer on the substrate. The deposition process may be performed using a vacuum deposition method. For example, the vacuum deposition method may include an epitaxial deposition method (e.g., for forming a single crystalline layer). In some embodiments, the deposition system 20 may be configured to deposit a thin layer (e.g., 105 of FIG. 6) on a substrate (e.g., 102 of FIG. 2). The thin layer 105 may include, for example, a single-crystalline silicon layer or a single-crystalline silicon germanium (SiGe) layer. The photolithography system 30 may be configured to perform a photolithography process of forming a photomask pattern on the substrate 102. The etching system 40 may be configured to perform an etching process. The ashing system 50 may be configured to perform an ashing process of removing the photomask pattern from the substrate 102. Each of the thin-film deposition process, the photolithography process, the etching process, and the ashing process may be a unit process for fabricating a semiconductor device and/or a display device. For example, the semiconductor device and/or the display device may be fabricated through such processes, which are adaptively or repeatedly performed on the substrate.

Figure 2:
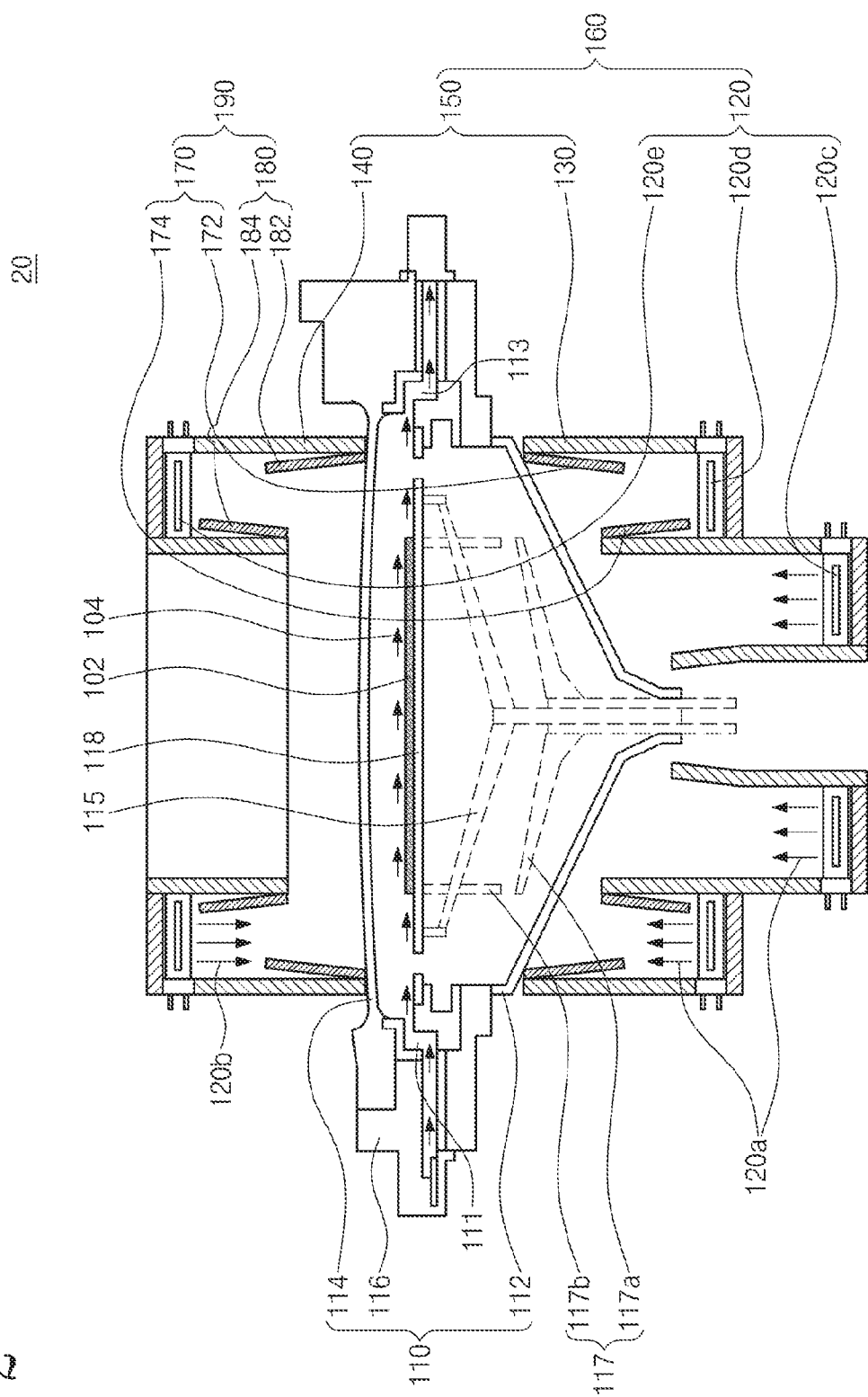
FIG. 2 is a sectional view illustrating a deposition system of FIG. 1, according to some embodiments of the inventive concepts.

FIG. 2 is a sectional view illustrating an example of the deposition system 20 of FIG. 1, according to some embodiments of the inventive concepts.

Referring to FIG. 2, the deposition system 20 may include a lamp-type epitaxial deposition system. As an example, the deposition system 20 may include one or more of a chamber 110, a susceptor 118, a heating module 160, and at least one reflection control module 190. The substrate 102 may be provided in the chamber 110. The susceptor 118 may be configured to hold or fasten the substrate 102 thereon. The deposition system 20 may be configured to supply reaction gas 104 onto the substrate 102. The heating module 160 may be configured to heat the substrate 102 using, for example, bottom light 120a and top light 120b. The bottom light 120a may be incident on a bottom surface of the substrate 102. The top light 120b may be incident on a top surface of the substrate 102. The reflection control module 190 may be configured to locally control incident intensities of one or more of the bottom light 120a and the top light 120b, and thus, it is possible to reduce a spatial variation in temperature of the substrate 102, after or during the heating step.

The chamber 110 may be configured to allow for the deposition process to be performed on the substrate 102 in a vacuum state. As an example, the chamber 110 may include a lower dome 112, an upper dome 114, and an edge ring 116. The lower dome 112 may be provided below the susceptor 118. The lower dome 112 may be, for example, a funnel shape. The upper dome 114 may be provided over the susceptor 118 to veil the substrate 102. The lower dome 112 and the upper dome 114 may be transparent. For example, the lower dome 112 and the upper dome 114 may be formed of or include quartz or glass. The edge ring 116 may be provided to enclose an edge of the lower dome 112 and/or the upper dome 114. The lower dome 112 and the upper dome 114 may be jointed to the edge ring 116. At least one of the lower dome 112 and the upper dome 114 may be detachable from the edge ring 116, when the substrate 102 is loaded on the susceptor 118. Alternatively, the edge ring 116 may be divided into two pieces in a vertical direction. The edge ring 116 may be provided to define a gas inlet 111 and a gas outlet 113. The gas inlet 111 and the gas outlet 113 may be provided at opposite sides of the edge ring 116. The reaction gas 104 may be supplied into the chamber 110 through the gas inlet 111. Also, the reaction gas 104 may be exhausted from the chamber 110 through the gas outlet 113. The reaction gas 104 may include silane ($SiH_4$), di-silane (DCS; $SiH_2Cl_2$), or germane ($GeH_4$).

The susceptor 118 may be disposed between the gas inlet 111 and the gas outlet 113. The reaction gas 104 may flow from the gas inlet 111 to the gas outlet 113. For example, the reaction gas 104 may be supplied onto the substrate 102. Alternatively, the reaction gas 104 may flow from a top of the substrate 102 to a bottom of the substrate 102. The susceptor 118 may be transparent. For example, the susceptor 118 may be formed of or include quartz or glass. The susceptor 118 may be supported by a supporter 115.

The supporter 115 may be disposed between the susceptor 118 and the lower dome 112. The supporter 115 may be located at a center of the lower dome 112, when viewed in top view. The substrate 102, along with the susceptor 118 thereunder, may be elevated by a lifter 117.

The lifter 117 may include a lifting shaft 117a and lifting pins 117b. The lifting shaft 117a may be disposed between the supporter 115 and the lower dome 112. The lifting shaft 117a may be configured to allow for the lifting pins 117b to be moved in a vertical direction. The lifting pins 117b may be provided on the lifting shaft 117a. The lifting pins 117b may penetrate the susceptor 118. Accordingly, the lifting pins 117b may make it possible for the substrate 102 to be moved in the vertical direction. For example, the substrate 102 may be separated from the susceptor 118 by the lifting pins 117b. The substrate 102 may be unloaded from the chamber 110 by a robot arm (not shown).

The heating module 160 may be provided below the lower dome 112 and on the upper dome 114. As an example, the heating module 160 may include at least one heat source 120 and a reflection housing 150. A heat source, as referred to herein, may include one or more various light sources, also referred to herein interchangeably as lamps. For example, the heat sources 120 may include one or more filament lamps. A light source may generate light which provides heating of a surface upon which the generated light is incident. In some embodiments, one or more light sources generate light which propagates at one or more various sets of wavelengths. For example, a light source may generate light which propagates in one or more various sets of wavelengths, including one or more of infrared, visible, ultraviolet, X-ray, gamma, microwave, radio, some combination thereof, etc. It will be understood that any reference to a heat source, heat sources, etc. herein encompasses a reference to at least one light source. The heat sources 120 may generate the bottom light 120a and the top light 120b. The reflection housing 150 may be configured to reflect the bottom light 120a and the top light 120b (for example, toward the substrate 102).

In some embodiments, the heat sources 120 may include first to third heat sources 120c-120e. The first and second heat sources 120c and 120d may be disposed below the substrate 102 and in the reflection housing 150. The third heat sources 120e may be disposed on the substrate 102 and in the reflection housing 150. The first and second heat sources 120c, 120d may generate the bottom light 120a. The third heat sources 120e may generate the top light 120b. In some embodiments, one or more of the heat sources 120 described herein includes at least one light source.

The reflection housing 150 may be provided to cover the heat sources 120 (e.g., in a direction facing the substrate 102). The reflection housing 150 may be configured to allow for the bottom light 120a and the top light 120b to be concentrated on the substrate 102. In some embodiments, the reflection housing 150 may include a lower reflection housing 130 and an upper reflection housing 140. The lower reflection housing 130 may be provided below and aligned with the lower dome 112. The upper reflection housing 140 may be provided on and aligned with the upper dome 114. The lower reflection housing 130 may be disposed below the lower dome 112. The first and second heat sources 120c and 120d may be disposed between the lower dome 112 and the lower reflection housing 130. The lower reflection housing 130 may reflect the bottom light 120a (e.g., toward the bottom surface of the substrate 102. The upper reflection housing 140 may be disposed on the upper dome 114. The upper reflection housing 140 may be provided between the upper dome 114 and the upper reflection housing 140. The upper reflection housing 140 may reflect the top light 120b (e.g., toward the top surface of the substrate 102).

The reflection control module 190 may be provided in one or more of the lower reflection housing 130 and the upper reflection housing 140. In some embodiments, the reflection control module 190 may include one or more of a lower reflection control module 170 and an upper reflection control module 180. The lower reflection control module 170 may be provided between the first and second heat sources 120c and 120d and the lower dome 112 and in the lower reflection housing 130. In some embodiments, the lower reflection control module 170 may include one or more of a first outer reflection control ring 172 and a first inner reflection control ring 174. The lower reflection control module 170 may be configured to control a reflection angle of the bottom light 120a. The lower reflection control module 170 may be configured to control a trajectory of at least the bottom light 120a, based on reflecting at least a portion of the bottom light 120a. The upper reflection control module 180 may be provided between the third heat sources 120e and the upper dome 114 and in the upper reflection housing 140. In some embodiments, the upper reflection control module 180 may include one or more of a second outer reflection control ring 182 and a second inner reflection control ring 184. The upper reflection control module 180 may be configured to control a reflection angle of the top light 120b. The upper reflection control module 180 may be configured to control a trajectory of at least the top light 120b, based on reflecting at least a portion of the top light 120b.

Figure 3:
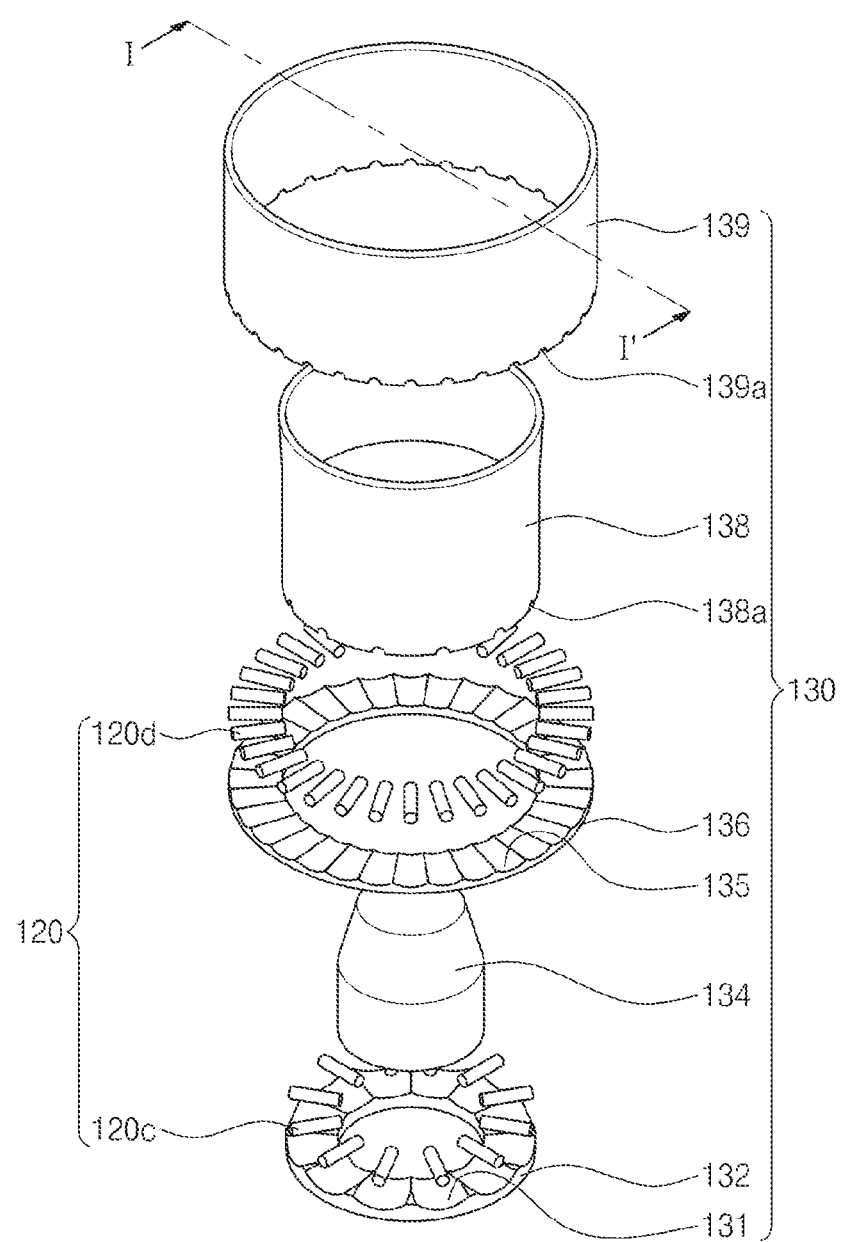
FIG. 3 is an exploded perspective view illustrating a lower reflection housing of FIG. 2, according to some embodiments of the inventive concepts.
Figure 4:
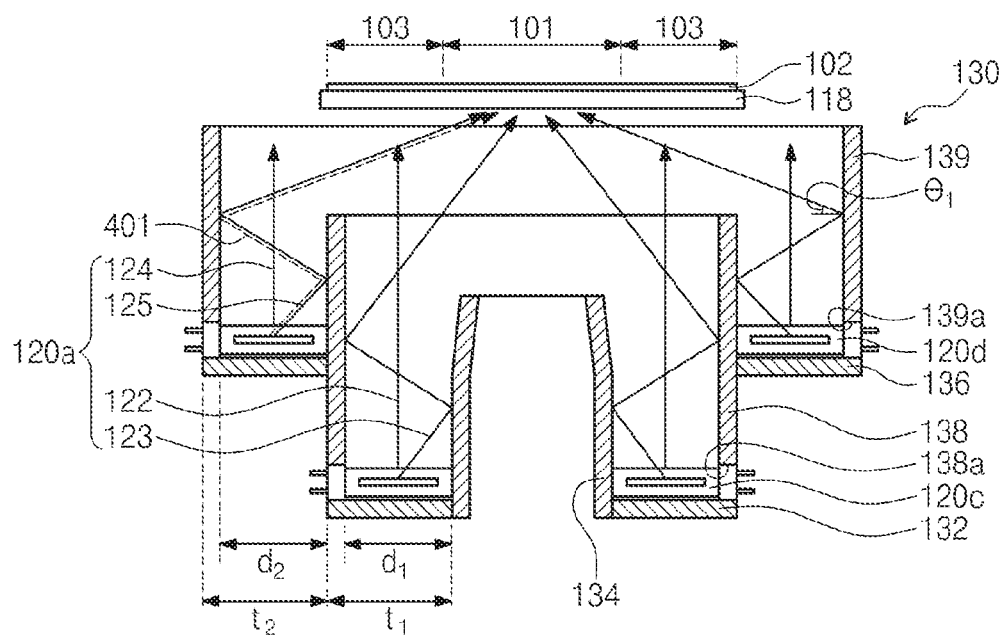
FIG. 4 is a sectional view taken along line I-I' of FIG. 3.

FIG. 3 is an exploded perspective view illustrating a lower reflection housing of FIG. 2, according to some embodiments of the inventive concepts. FIG. 4 is a sectional view taken along line I-I' of FIG. 3.

Referring to FIGS. 3 and 4, the lower reflection housing 130 may include an inner cover reflection ring 132, a first inner reflection ring 134, an outer cover reflection ring 136, a middle reflection ring 138, and a first outer reflection ring 139. The first and second heat sources 120c and 120d may be provided on the inner cover reflection ring 132 and the outer cover reflection ring 136, respectively. The inner cover reflection ring 132 and the outer cover reflection ring 136 may reflect the bottom light 120a (e.g., toward the bottom surface of the substrate 102). The first heat sources 120c may be disposed between the first inner reflection ring 134 and the middle reflection ring 138. The first inner reflection ring 134 and the middle reflection ring 138 may be provided to reflect the bottom light 120a (e.g., toward each other). The second heat sources 120d may be disposed between the middle reflection ring 138 and the first outer reflection ring 139. The middle reflection ring 138 and the first outer reflection ring 139 may be provided to reflect the bottom light 120a (e.g., toward each other). The bottom light 120a may be reflected toward the bottom surface of the substrate 102. In some embodiments, at least one of the first inner reflection ring 134, the middle reflection ring 138, and the first outer reflection ring 139 may include a cylindrical reflection tube.

The inner cover reflection ring 132 may be disposed outside the first inner reflection ring 134. The inner cover reflection ring 132 may be disposed below the middle reflection ring 138. The inner cover reflection ring 132 may be coupled to inner reflection ring 134 and the middle reflection ring 138. An inner diameter of the inner cover reflection ring 132 may be substantially equal to an outer diameter of the first inner reflection ring 134. For example, the inner diameter of the inner cover reflection ring 132 may range from about 246 mm to 286 mm. The inner cover reflection ring 132 and the middle reflection ring 138 may have the same outer diameter. The outer diameter of the inner cover reflection ring 132 may be about 304 mm. The inner cover reflection ring 132 may be provided to have first semi-cylindrical reflection concaves 131. For example, the inner cover reflection ring 132 may have about twelve first semi-cylindrical reflection concaves 131. The first heat sources 120c may be respectively disposed on the first semi-cylindrical reflection concaves 131 (e.g., in a one-to-one manner). The first semi-cylindrical reflection concaves 131 may reflect the bottom light 120a generated by the first heat sources 120c (e.g., toward the substrate 102). The first semi-cylindrical reflection concaves 131 may have a curvature radius of about 41 mm.

The first inner reflection ring 134 may be provided in the inner cover reflection ring 132. The lower dome 112 may include a portion extending into the first inner reflection ring 134. The first inner reflection ring 134 may be provided in the middle reflection ring 138 and the first outer reflection ring 139. The first inner reflection ring 134 may be disposed below the first outer reflection ring 139. For example, the first inner reflection ring 134 may have a length ranging from about 150 mm to about 200 mm. The first inner reflection ring 134 may be disposed spaced apart from the middle reflection ring 138. A first distance d1 between the first inner reflection ring 134 and the middle reflection ring 138 may be less than a first width t1 of the inner cover reflection ring 132. The bottom light 120a may be reflected between the first inner reflection ring 134 and the middle reflection ring 138.

The outer cover reflection ring 136 may be disposed on the inner cover reflection ring 132. An inner diameter of the outer cover reflection ring 136 may be the same as an outer diameter of the inner cover reflection ring 132. In certain embodiments, the inner diameter of the outer cover reflection ring 136 may be greater than the outer diameter of the inner cover reflection ring 132. The outer cover reflection ring 136 may be coupled to a sidewall of the middle reflection ring 138. The outer cover reflection ring 136 may be provided around the middle reflection ring 138. For example, the outer cover reflection ring 136 may be disposed at an intermediate level of the middle reflection ring 138. The inner diameter of the outer cover reflection ring 136 may be the same as the outer diameter of the middle reflection ring 138. The outer diameter of the outer cover reflection ring 136 may be the same as the outer diameter of the first outer reflection ring 139. The outer cover reflection ring 136 may have an inner diameter of about 304 mm and an outer diameter ranging from about 424 mm to about 460 mm. The outer cover reflection ring 136 may be coupled to a lower portion of the first outer reflection ring 139. The outer cover reflection ring 136 may have a plurality of second semi-cylindrical reflection concaves 135. For example, the number of the second semi-cylindrical reflection concaves 135 provided on the outer cover reflection ring 136 may be about 32. The second heat sources 120d may be respectively provided on the second semi-cylindrical reflection concaves 135 (e.g., in a one-to-one manner). The second semi-cylindrical reflection concaves 135 may reflect the bottom light 120a generated by the second heat sources 120d (e.g., toward the substrate 102). The second semi-cylindrical reflection concaves 135 may have a curvature radius of about 41 mm.

The middle reflection ring 138 may be provided through the outer cover reflection ring 136. The middle reflection ring 138 may be disposed on the inner cover reflection ring 132. The middle reflection ring 138 may be disposed between the first inner reflection ring 134 and the first outer reflection ring 139. The middle reflection ring 138 may be longer than the first inner reflection ring 134. The middle reflection ring 138 may have a length ranging from about 250 mm to about 300 mm. The middle reflection ring 138 may have a plurality of first socket concaves 138a. The first socket concaves 138a may be disposed adjacent to the inner cover reflection ring 132. The first heat sources 120c may be provided on the inner cover reflection ring 132 and through the first socket concaves 138a. The first heat sources 120c may have the same length as the first width t1. In certain embodiments, the first heat sources 120c may have the same length as the first distance d1.

The first outer reflection ring 139 may be disposed on the outer cover reflection ring 136. The first outer reflection ring 139 may be located at a higher level than the middle reflection ring 138. The first outer reflection ring 139 may have a length of, for example, about 175 mm. The first outer reflection ring 139 may be disposed spaced apart from the middle reflection ring 138. For example, a second distance d2 between the first outer reflection ring 139 and the middle reflection ring 138 may be smaller than a second width t2 of the outer cover reflection ring 136. The first outer reflection ring 139 may have a plurality of second socket concaves 139a. The second socket concaves 139a may be disposed adjacent to the outer cover reflection ring 136. The second heat sources 120d may be provided through the second socket concaves 139a and on the outer cover reflection ring 136.

Referring back to FIG. 4, the bottom light 120a may be incident on the bottom surface of the substrate 102. The substrate 102 may be heated by the bottom light 120a. For example, the substrate 102 may be heated up to a temperature of about 500° C. to 800° C. The substrate 102 may include a center region 101 and an edge region 103. The center region 101 may be disposed in the edge region 103. The edge region 103 may surround the center region 101.

A fraction of the bottom light 120a may propagate along a trajectory which is directly incident on the substrate 102 from the first heat sources 120c. Another fraction of the bottom light 120a may be reflected by the first inner reflection ring 134, the middle reflection ring 138, and the first outer reflection ring 139 to propagate along a trajectory which is incident on the substrate 102. For example, the bottom light 120a may include inner direct light 122, inner reflection light 123, outer direct light 124, and outer reflection light 125. The inner direct light 122 and the inner reflection light 123 may be generated by the first heat sources 120c. The inner direct light 122 may be a part of the bottom light 120a passing between the first inner reflection ring 134 and the middle reflection ring 138, without any reflection thereby. The inner direct light 122 may propagate along a trajectory which is incident on the edge region 103. The inner reflection light 123 may be another part of the bottom light 120a reflected by the first inner reflection ring 134 and the middle reflection ring 138. The majority of the inner reflection light 123 may propagate along a trajectory which is incident on the center region 101. A relatively small part of the inner reflection light 123 may also be incident on the edge region 103. The outer direct light 124 and the outer reflection light 125 may be generated by the second heat sources 120d. The outer direct light 124 may be a part of the bottom light 120a passing between the middle reflection ring 138 and the first outer reflection ring 139, without any reflection thereby. A part of the outer direct light 124 may be provided outside the substrate 102. In some embodiments, another part of the outer direct light 124 may be incident on not only the center region 101 but also the edge region 103. The outer reflection light 125 may be another fraction of the bottom light 120a reflected by the middle reflection ring 138 and the first outer reflection ring 139.

The middle reflection ring 138 and the first outer reflection ring 139 may be configured to allow for the outer reflection light 125 to have a first reflection angle θ1. For example, the first reflection angle θ1 may be about 10° to 20°. The majority of the outer reflection light 125 may be incident on the center region 101. By contrast, the first outer reflection ring 139 may reflect the outer reflection light 125 at a reflection angle of about 0° to 90°. As a result of reflecting off of the middle reflection ring 138 and the first outer reflection ring 139, at least a portion of the outer reflection light may propagate along a trajectory 401 which is incident upon the center region 101. In addition, the middle reflection ring 138 and the first outer reflection ring 139 may be configured to reflect the outer reflection light 125 to cause at least a portion of the light 125, which may include a majority of the light 125, to propagate along trajectory 401. The trajectory 401 may be referred to herein as a first trajectory 401. A part of the outer reflection light 125 may be incident on the edge region 103.

Figure 5:
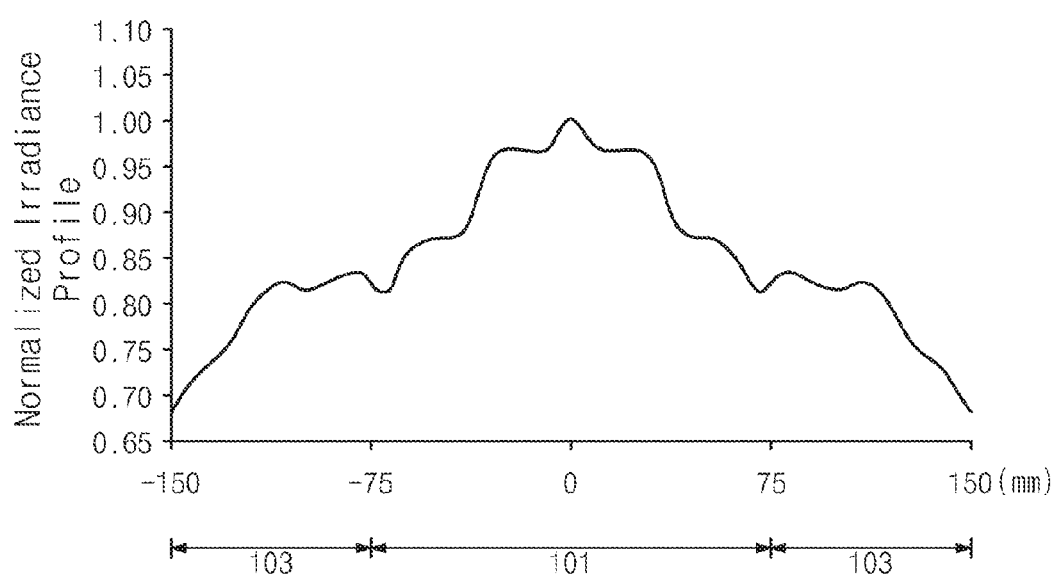
FIG. 5 is a graph showing a normalized irradiance profile of bottom light of FIG. 4, according to some embodiments of the inventive concepts.

FIG. 5 is a graph showing a normalized irradiance profile of the bottom light 120a of FIG. 4, according to some embodiments of the inventive concepts.

Referring to FIGS. 4 and 5, according to a normalized irradiance profile of the bottom light 120a, the irradiance of the bottom light 120a was higher at the center region 101 than the edge region 103. The center region 101 may be heated by not only the inner reflection light 123 but also the outer reflection light 125 which propagates along trajectory 401. By contrast, the edge region 103 may be merely heated by the inner direct light 122. Accordingly, the center region 101 may be heated to have a higher temperature than that of the edge region 103.

Figure 6:
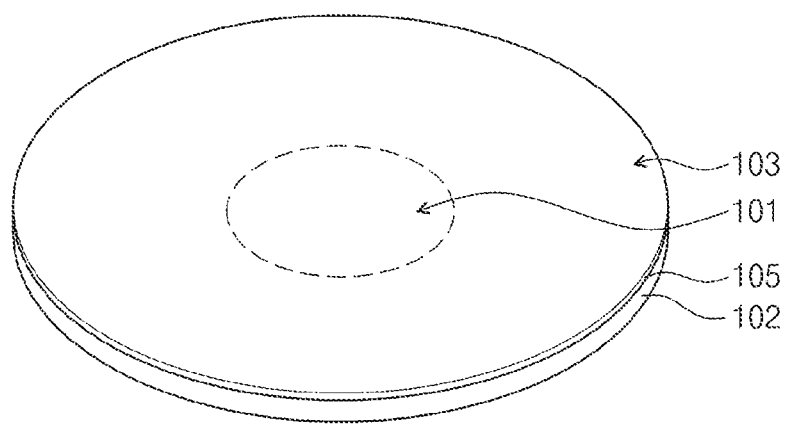
FIG. 6 is a perspective view illustrating a thin layer on a substrate, shown in FIG. 4, according to some embodiments of the inventive concepts.

FIG. 6 is a perspective view illustrating the substrate 102 and the thin layer 105 thereon, shown in FIG. 4, according to some embodiments of the inventive concepts.

Referring to FIG. 6, the thin layer 105 may be formed on the substrate 102. A thickness of the thin layer 105 may be proportional to a temperature of the substrate 102. Since the edge region 103 is heated to have a lower temperature than that of the center region 101, the thin layer 105 may be formed to have a smaller thickness on the edge region 103 than on the center region 101. The thin layer 105 may be formed on the entire top surface of the substrate 102. However, on certain embodiments, the thin layer 105 may be formed on a part of the top surface of the substrate 102.

Figure 7:
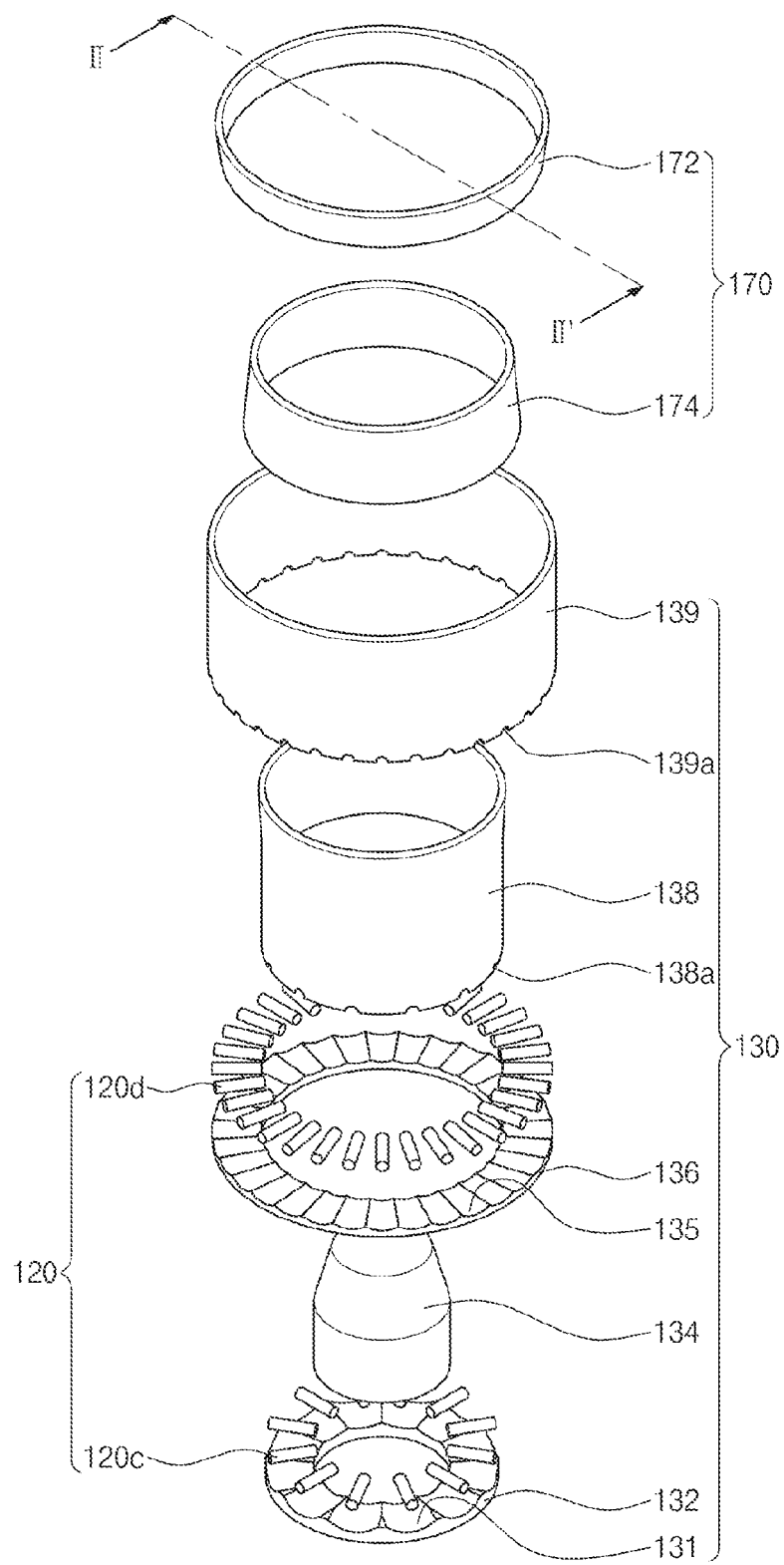
FIG. 7 is an exploded perspective view illustrating a lower reflection control module of FIG. 2, according to some embodiments of the inventive concepts.
Figure 8:
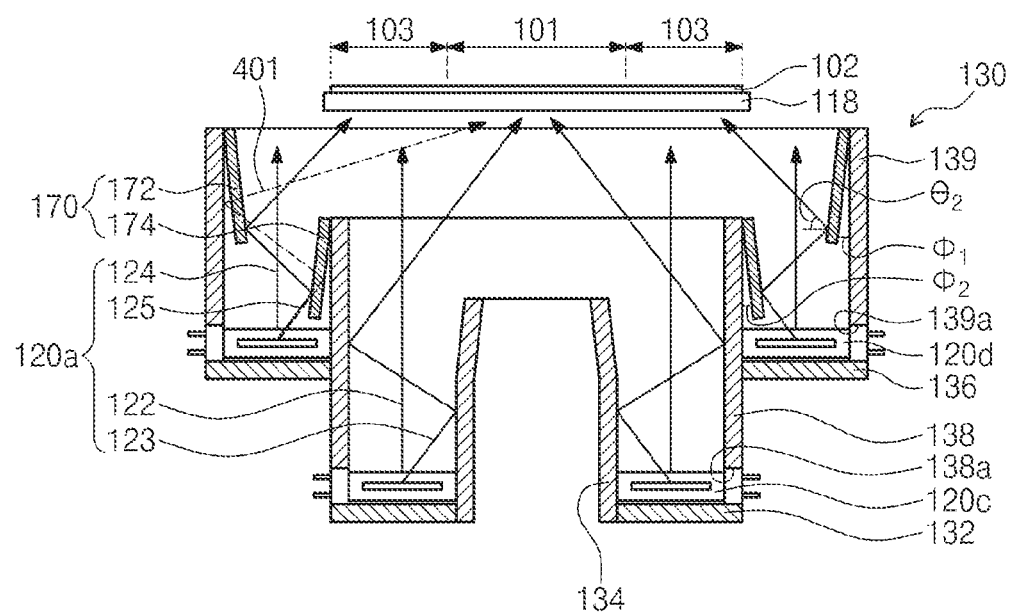
FIG. 8 is a sectional view taken along line II-II' of FIG. 7.

FIG. 7 is an exploded perspective view illustrating a lower reflection control module 170 of FIG. 2, according to some embodiments of the inventive concepts. FIG. 8 is a sectional view taken along line II-IT of FIG. 7.

Referring to FIGS. 7 and 8, the lower reflection control module 170 may be disposed between the middle reflection ring 138 and the first outer reflection ring 139. The lower reflection control module 170 may be configured to reflect the outer reflection light 125 (e.g., toward the edge region 103), such that at least a portion of the outer reflection light is redirected from propagating along the first trajectory 401 to propagating along a separate trajectory. For example, as shown in FIG. 8, the elements 172, 174 of the lower reflection control module 170 reflect the outer reflection light 125 which causes the outer reflection light 125 to be redirected from propagating along trajectory 401 to propagating along a different trajectory. As shown in FIG. 8, the different trajectory, also referred to herein as the second trajectory, is incident upon the edge region 103 of the substrate 102. In some embodiments, the lower reflection control module 170 may be configured to reflect a majority of the outer reflection light 125 at a second reflection angle $\theta2$. The second reflection angle $\theta2$ may be greater than the first reflection angle $\theta1$. For example, the second reflection angle $\theta2$ may range from about 20° to about 30°. In certain embodiments, the lower reflection control module 170 may reflect the outer reflection light 125 within an angle ranging from about 0° to 90°. The lower reflection control module 170 may reflect a part of the outer reflection light 125 toward the center region 101.

The susceptor 118, the first and second heat sources 120c and 120d, the inner direct light 122, the inner reflection light 123, the outer direct light 124, the inner cover reflection ring 132, the first inner reflection ring 134, the outer cover reflection ring 136, the middle reflection ring 138, and the first outer reflection ring 139 may be configured to have substantially the same features as those of FIGS. 3 and 4.

The lower reflection control module 170 may include additional lower reflection rings provided between the middle reflection ring 138 and the first outer reflection ring 139. In some embodiments, the lower reflection control module 170 may include a first outer reflection control ring 172 and a first inner reflection control ring 174. The first outer reflection control ring 172 may have a diameter greater than that of the first inner reflection control ring 174. The first inner reflection control ring 174 may be positioned at a lower level than that of the first outer reflection control ring 172. The first outer reflection control ring 172 and the first inner reflection control ring 174 may reflect the outer reflection light 125 at the second reflection angle $\theta2$.

The first outer reflection control ring 172 may be provided on an inner sidewall of the first outer reflection ring 139. In some embodiments, the first outer reflection control ring 172 may be fastened to the inner sidewall of the first outer reflection ring 139. A top of the first outer reflection control ring 172 may be positioned at the same level as that of the first outer reflection ring 139. The first outer reflection control ring 172 may have a vertical length smaller than that of the first outer reflection ring 139. The first outer reflection control ring 172 may be provided to be increasingly spaced apart from the first outer reflection ring 139, in a direction away from the susceptor 118. The first outer reflection control ring 172 may be slanted toward the middle reflection ring 138. The first outer reflection control ring 172 may be shaped like a truncated hollow cylinder tapering in a downward direction. For example, the first outer reflection control ring 172 may be inclined to have a first inclined angle $\phi1$ ranging from about 0.5° to about 10°. The second reflection angle $\theta2$ may be controlled depending on the first inclined angle $\phi1$. The first inclined angle $\phi1$ may be proportional to the second reflection angle $\theta2$. For example, the greater the first inclined angle $\phi1$, the greater the second reflection angle $\theta2$. This relation may be used to increase an intensity of the outer reflection light 125 propagating toward the edge region 103. The first outer reflection control ring 172 may be configured to reflect the majority of the outer reflection light 125, along the second trajectory, toward the edge region 103 of the substrate 102. In certain embodiments, the first outer reflection control ring 172 may be configured to reflect the outer reflection light 125 toward the center region 101. Accordingly, by using the first outer reflection control ring 172, it is possible to control a spatial variation in temperature of the substrate 102.

The first inner reflection control ring 174 may be provided on an outer sidewall of the middle reflection ring 138. In some embodiments, the first inner reflection control ring 174 may be fastened to the outer sidewall of the middle reflection ring 138. A top of the first inner reflection control ring 174 may be positioned at the same level as that of the middle reflection ring 138. The first inner reflection control ring 174 may be shorter than the middle reflection ring 138. The first inner reflection control ring 174 may be inclined in a direction different from the inclination of the first outer reflection control ring 172. The first inner reflection control ring 174 may be provided in such a way that a distance from the middle reflection ring 138 increases in a direction away from the susceptor 118. For example, the first inner reflection control ring 174 may be provided in such a way that a distance from the first outer reflection ring 139 decreases in a direction away from the susceptor 118. The first inner reflection control ring 174 may be shaped like a truncated hollow cylinder tapering in an upward direction. For example, the first inner reflection control ring 174 may be inclined to have a second inclined angle $\phi2$ ranging from about 0.5° to about 10°. The second inclined angle $\phi2$ may be proportional to the second reflection angle $\theta2$. For example, the greater the second inclined angle $\phi2$, the greater the second reflection angle $\theta2$. This relation may be used to increase an intensity of the outer reflection light 125 propagating toward the edge region 103. For example, by using the first inner reflection control ring 174, it is possible to control a spatial variation in temperature of the substrate 102.

The first inner reflection control ring 174 may reflect the outer reflection light 125 toward the first outer reflection control ring 172 to cause the light 125 to propagate along a second trajectory which reflects off of the first outer reflection control ring and is incident upon the edge region 103 of the substrate 102.

Figure 9:
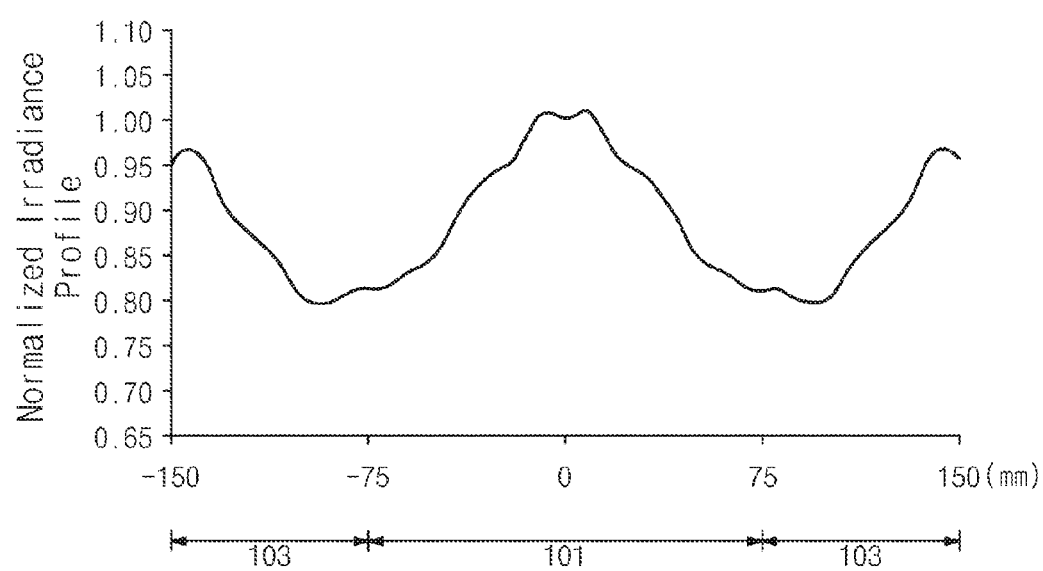
FIG. 9 is a graph showing a normalized irradiance profile of bottom light of FIG. 8, according to some embodiments of the inventive concepts.

FIG. 9 is a graph showing a normalized irradiance profile of the bottom light 120a of FIG. 8, according to some embodiments of the inventive concepts.

Referring to FIG. 9, according to a normalized irradiance profile of the bottom light 120a, the irradiances at the center and edge regions 101 and 103 were substantially equal to each other. As a result, the substrate 102 may be heated to have substantially the same temperature at the center and edge regions 101 and 103. Furthermore, the substantially equalized irradiances at the center and edge regions 101 and 103, also referred to herein as a substantially uniform irradiance of the substrate, may result in a reduced difference in thickness of the thin layer 105 between the center and edge regions 101 and 103, and thus may result in improved thin layer 105 thickness uniformity.

Figure 10:
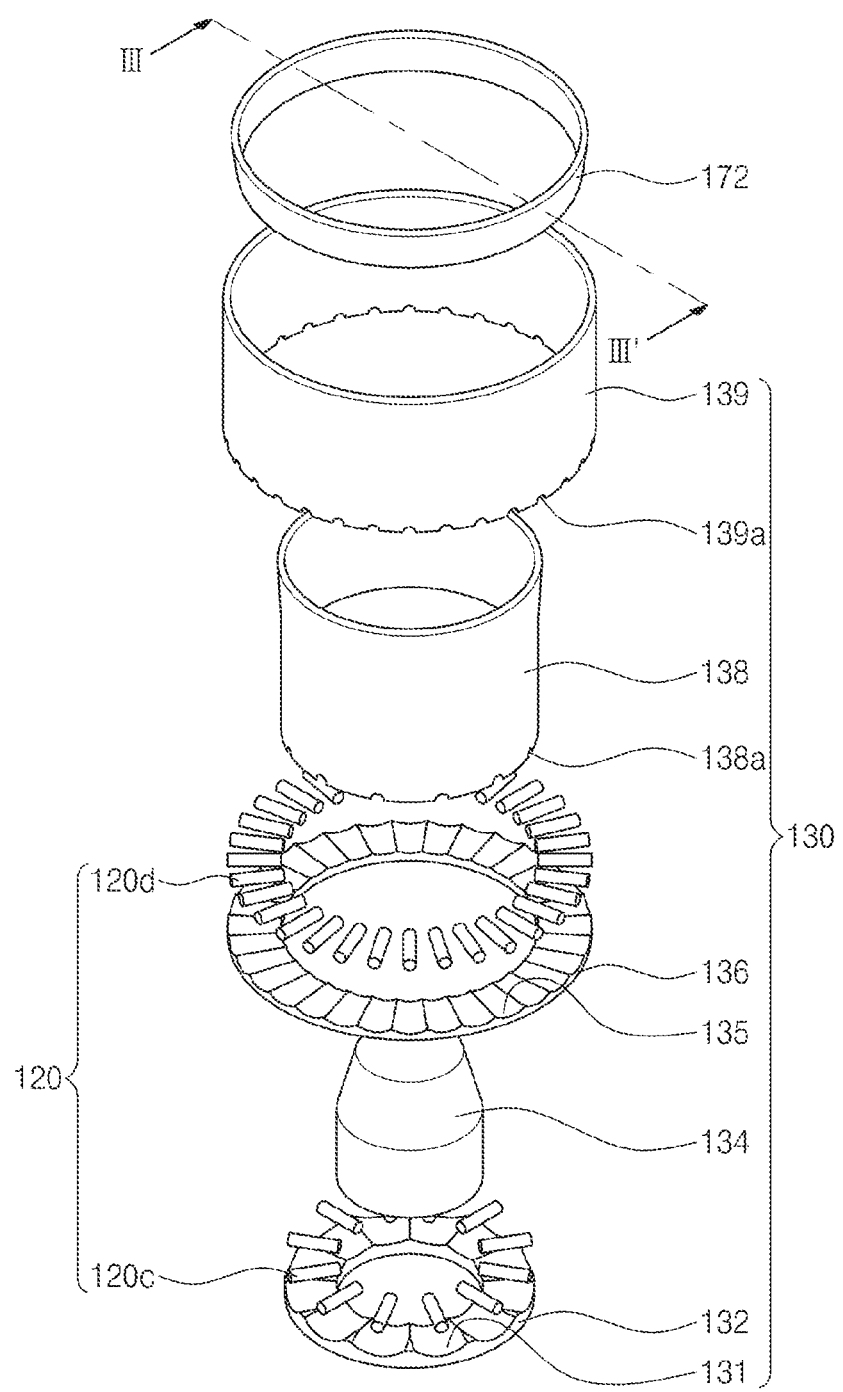
FIG. 10 is an exploded perspective view illustrating a lower reflection control module of FIG. 7, according to some embodiments of the inventive concepts.
Figure 11:
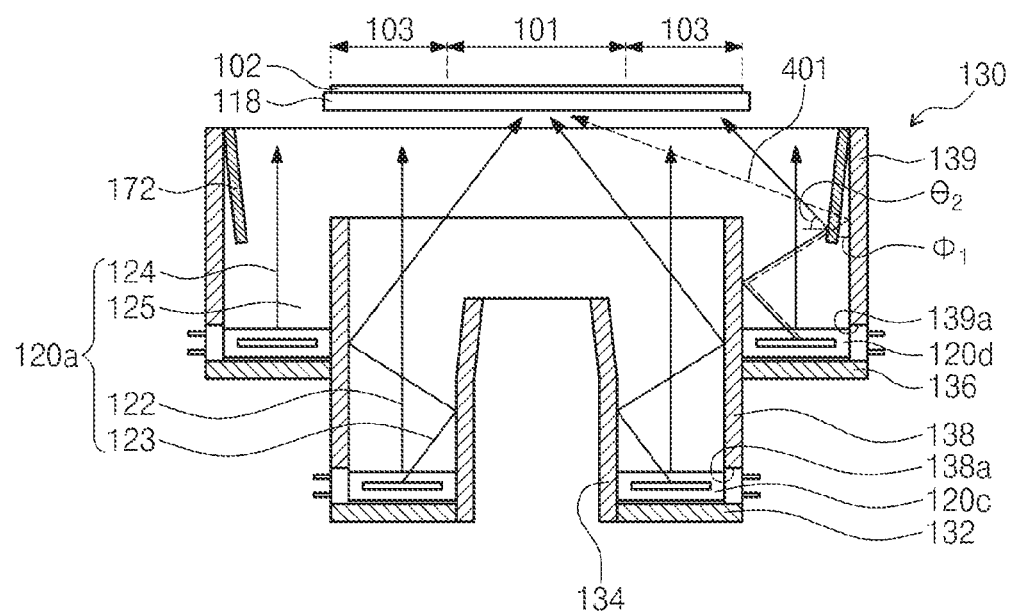
FIG. 11 is a sectional view taken along line III-III' of FIG. 10.

FIG. 10 is an exploded perspective view illustrating a lower reflection control module 170 of FIG. 7, according to some embodiments of the inventive concepts, and FIG. 11 is a sectional view taken along line III-III' of FIG. 10.

Referring to FIGS. 10 and 11, the first outer reflection control ring 172 may reflect the outer reflection light 125 to cause the light 125 to be redirected, from propagating along a first trajectory 401, to propagating along a second trajectory which is incident on the edge region 103 of the substrate 102, as shown in at least FIG. 11. The outer reflection light 125 emitted from the second heat sources 120d may be incident on the middle reflection ring 138 and the first outer reflection control ring 172. The outer reflection light 125 may be reflected, along the illustrated second trajectory, between the middle reflection ring 138 and the first outer reflection control ring 172. The first outer reflection control ring 172 may reflect the outer reflection light 125, along the illustrated second trajectory, toward the edge region 103 at the second reflection angle θ2.

The susceptor 118, the first and second heat sources 120c and 120d, the inner direct light 122, the inner reflection light 123, the outer direct light 124, the inner cover reflection ring 132, the first inner reflection ring 134, the outer cover reflection ring 136, the middle reflection ring 138, and the first outer reflection ring 139 may be configured to have substantially the same features as those of FIGS. 6 and 7. In the present embodiments, the first inner reflection control ring 174 of FIGS. 6 and 7 may not be provided.

Figure 12:
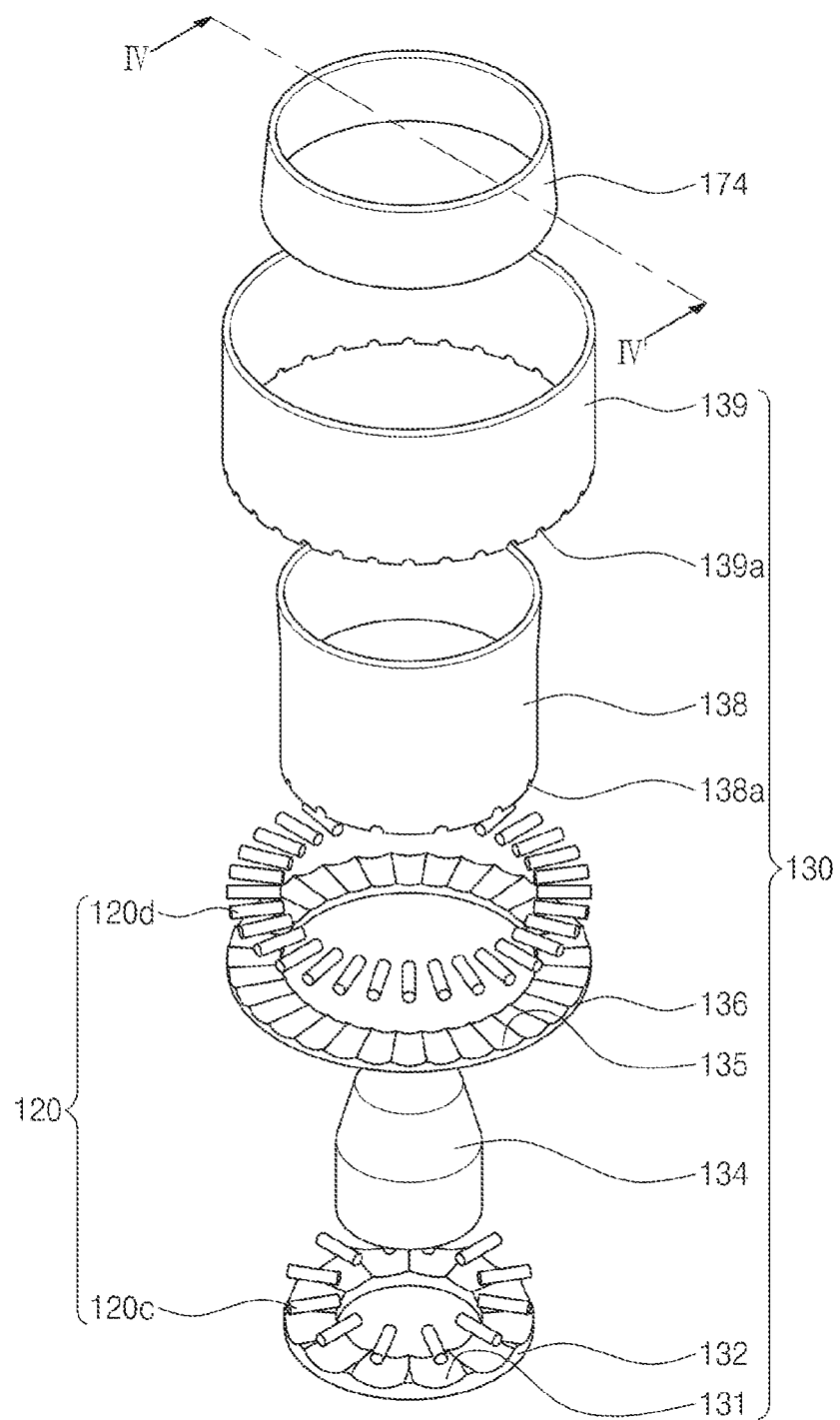
FIG. 12 is an exploded perspective view illustrating a lower reflection control module of FIG. 7, according to some embodiments of the inventive concepts.
Figure 13:
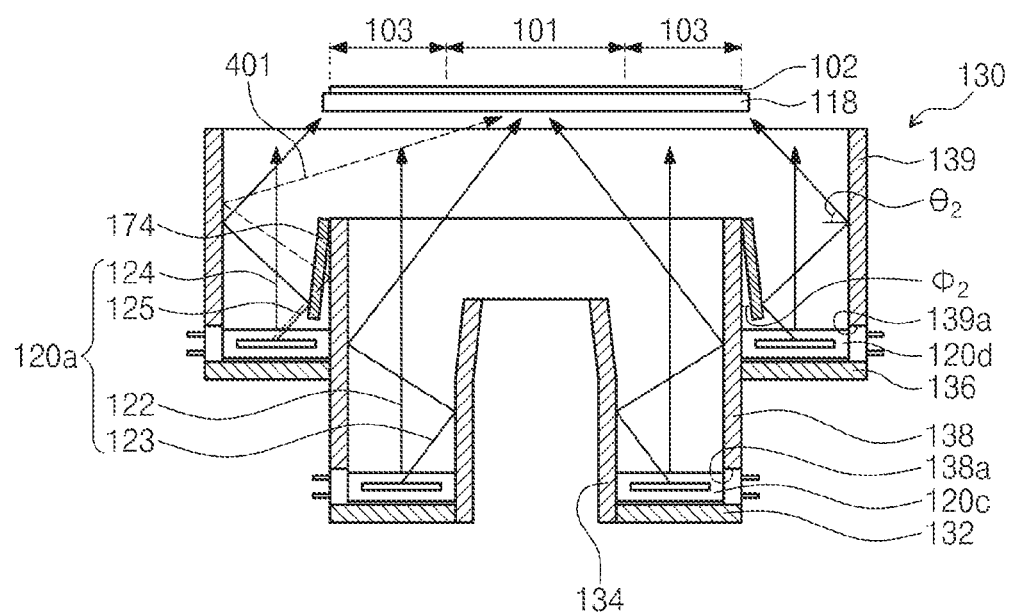
FIG. 13 is a sectional view taken along line IV-IV' of FIG. 12.

FIG. 12 is an exploded perspective view illustrating a lower reflection control module 170 of FIG. 7, according to some embodiments of the inventive concepts, and FIG. 13 is a sectional view taken along line IV-IV' of FIG. 12.

Referring to FIGS. 12 and 13, the first inner reflection control ring 174 and The first outer reflection ring 139 may reflect the outer reflection light 125 to cause the light 125 to be redirected, from propagating along a first trajectory 401, to propagating along a second trajectory which is incident on the edge region 103 of the substrate 102, as shown in at least FIG. 13. The outer reflection light 125 emitted from the second heat sources 120d may be incident on the first inner reflection control ring 174. The first inner reflection control ring 174 may reflect the outer reflection light 125, along the illustrated second trajectory, toward the first outer reflection ring 139. The first outer reflection ring 139 may reflect the outer reflection light 125, along the illustrated second trajectory, toward the edge region 103. The first inner reflection control ring 174 and the first outer reflection ring 139 may reflect the outer reflection light 125 at the second reflection angle θ2.

The susceptor 118, the first and second heat sources 120c and 120d, the inner direct light 122, the inner reflection light 123, the outer direct light 124, the inner cover reflection ring 132, the first inner reflection ring 134, the outer cover reflection ring 136, the middle reflection ring 138, and the first outer reflection ring 139 may be configured to have substantially the same features as those of FIGS. 6 and 7. In the present embodiments, the first inner reflection control ring 174 of FIGS. 6 and 7 may not be provided.

Figure 14:
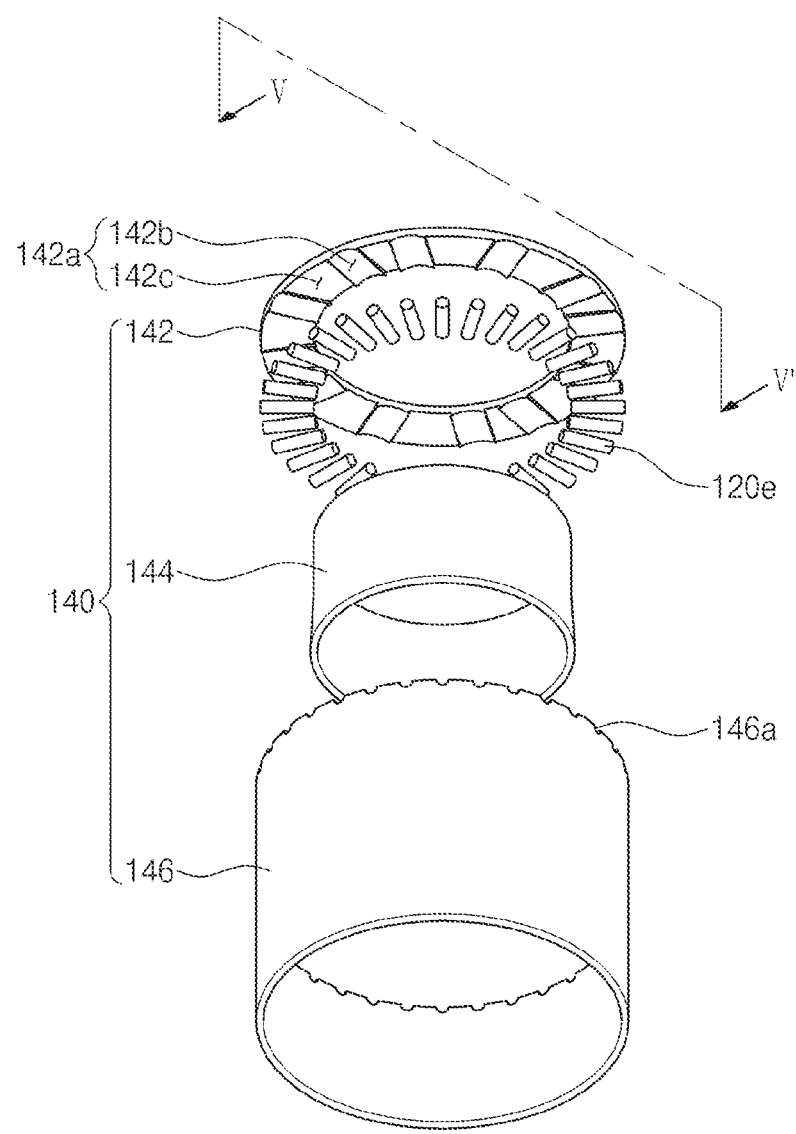
FIG. 14 is an exploded perspective view illustrating an upper reflection housing of FIG. 2, according to some embodiments of the inventive concepts.
Figure 15:
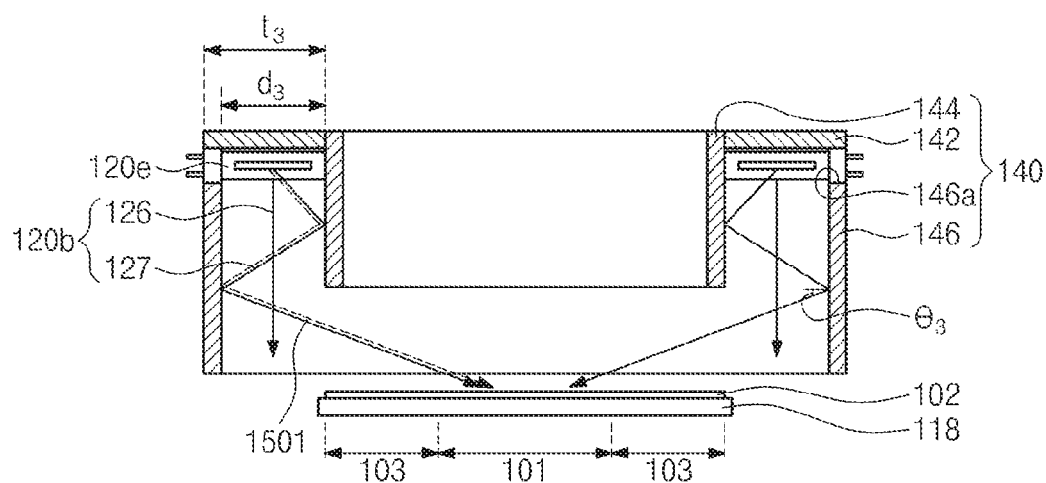
FIG. 15 is a sectional view taken along line V-V' of FIG. 14.

FIG. 14 is an exploded perspective view illustrating an upper reflection housing 140 of FIG. 2, according to some embodiments of the inventive concepts, and FIG. 15 is a sectional view taken along line V-V' of FIG. 14.

Referring to FIGS. 14 and 15, the upper reflection housing 140 may include an upper cover reflection ring 142, a second inner reflection ring 144, and a second outer reflection ring 146. The third heat sources 120e may be disposed below the upper cover reflection ring 142. The upper cover reflection ring 142 may include a reflection ring covering the third heat sources 120e. The third heat sources 120e may be disposed between the second inner reflection ring 144 and the second outer reflection ring 146. At least one of the second inner reflection ring 144 and the second outer reflection ring 146 may include a cylindrical tube.

The upper cover reflection ring 142 may be disposed on the second inner reflection ring 144 and the second outer reflection ring 146. The upper cover reflection ring 142 may be coupled to the second inner reflection ring 144 and the second outer reflection ring 146. The second inner reflection ring 144 may be disposed below the upper cover reflection ring 142. The upper cover reflection ring 142 and the second outer reflection ring 146 may have the same outer diameter. For example, the upper cover reflection ring 142 may have an inner diameter of about 304 mm and an outer diameter ranging from about 424 mm to about 460 mm. The upper cover reflection ring 142 may be provided to define upper reflection concaves 142a. The third heat sources 120e may be respectively provided below the upper reflection concaves 142a (e.g., in a one-to-one manner). The upper reflection concaves 142a may be slanted toward a center of the upper cover reflection ring 142. For example, the upper reflection concaves 142a may be inclined at an angle of about 1°-5° in a direction toward the center of the upper cover reflection ring 142. The upper reflection concaves 142a may reflect the top light 120b toward the substrate 102. In some embodiments, the upper reflection concaves 142a may include third semi-cylindrical reflection concaves 142b and flat reflection portions 142c. Each of the third semi-cylindrical reflection concaves 142b may have a rounded surface (not shown) capable of reflecting the top light 120b. The flat reflection portions 142c may have a flat reflection surface (not shown) capable of reflecting the top light 120b. The third semi-cylindrical reflection concaves 142b may allow for the top light 120b to be focused on the substrate 102. For example, the third semi-cylindrical reflection concaves 142b may be provided to correspond to the third heat sources 120e in a one-to-one manner. Each of the third semi-cylindrical reflection concaves 142b may have a curvature radius of about 41 mm. Each of the third semi-cylindrical reflection concaves 142b may have a width of about 41 mm. The flat reflection portions 142c may be configured to reflect the top light 120b toward the second inner reflection ring 144 and the second outer reflection ring 146. The flat reflection portions 142c may be disposed between the third semi-cylindrical reflection concaves 142b. The flat reflection portions 142c may be wider than the third semi-cylindrical reflection concaves 142b. For example, each of the flat reflection portions 142c may have a width ranging from about 75 mm to about 82 mm. Each of the flat reflection portions 142c may be provided to correspond to a plurality of the third heat sources 120e. For example, a pair of the third heat sources 120e may be provided below each of the flat reflection portions 142c. In some embodiments, the number of the third heat sources 120e may be about 32.

The number of the third semi-cylindrical reflection concaves 142b may be about 10 to 12. The number of the flat reflection portions 142c may be about 10 or 11.

The second inner reflection ring 144 may be provided in the second outer reflection ring 146. The second outer reflection ring 146 may be provided to enclose the second inner reflection ring 144. The second inner reflection ring 144 may be shorter than the second outer reflection ring 146. For example, the second inner reflection ring 144 may have a length of about 100-110 mm.

The second outer reflection ring 146 may be disposed below the upper cover reflection ring 142. The second outer reflection ring 146 may be longer than the second inner reflection ring 144. For example, the second outer reflection ring 146 may have a length of about 225 mm. The second inner reflection ring 144 and the second outer reflection ring 146 may be disposed spaced apart from each other. For example, a distance d3 between the second inner reflection ring 144 and the second outer reflection ring 146 may be smaller than the third width t3 of the upper cover reflection ring 142. The second outer reflection ring 146 may have a plurality of third socket concaves 146a. The third socket concaves 146a may be formed adjacent to the upper cover reflection ring 142. The third heat sources 120e may be provided through the third socket concaves 146a and below the upper cover reflection ring 142.

Referring back to FIGS. 2, 4, and 15, the second outer reflection ring 146 may be provided on and aligned to the first outer reflection ring 139. Alternatively, the second outer reflection ring 146 may have an inner diameter smaller than that of the first outer reflection ring 139. The second inner reflection ring 144 may be provided on and aligned to the middle reflection ring 138.

Referring back to FIG. 15, the top light 120b may propagate along a trajectory which is incident on the top surface of the substrate 102. The substrate 102 may be heated by the top light 120b. For example, the substrate 102 may be heated up to a temperature of about 500-800° C. The top light 120b may be reflected between the second inner reflection ring 144 and the second outer reflection ring 146 to propagate along a trajectory which is incident on the substrate 102. In certain embodiments, the top light 120b emitted from the third heat sources 120e may propagate along a trajectory which is directly incident on the substrate 102. For example, the top light 120b may include upper direct light 126 and upper reflection light 127.

The upper direct light 126 may be a part of the top light 120b passing between the second inner reflection ring 144 and the second outer reflection ring 146 without any reflection thereby. The majority of the upper direct light 126 may propagate toward a region outside the substrate 102. In certain embodiments, a part of the upper direct light 126 may propagate along one or more trajectories which are incident on the center and edge regions 101 and 103 of the substrate 102.

The upper reflection light 127 may be another part of the top light 120b reflected by the second inner reflection ring 144 and the second outer reflection ring 146. The second outer reflection ring 146 may be disposed to reflect a part of the upper reflection light 127 toward the center region 101. As a result of reflecting off of the second inner reflection ring 144 and the second outer reflection ring 146, at least a portion of the upper reflection light 127 may propagate along a trajectory 1501 which is incident upon the center region 101. In addition, the second inner reflection ring 144 and the second outer reflection ring 146 may be configured to reflect the upper reflection light 127 to cause at least a portion of the light 127, which may include a majority of the light 127, to propagate along trajectory 1501. The trajectory 501 may be referred to herein as a first trajectory 1501. In certain embodiments, a part of the upper reflection light 127 may be incident on the edge region 103.

The second inner reflection ring 144 and the second outer reflection ring 146 may reflect the upper reflection light 127 at a third reflection angle θ3. For example, the third reflection angle θ3 may range from about 10° to 20°. The upper reflection light 127 may propagate along a first trajectory 1501 which is incident on the center region 101. In certain embodiments, the second outer reflection ring 146 may be configured to reflect the upper reflection light 127 at an angle ranging from about 0° to 90°. A part of the upper reflection light 127 may be incident on the edge region 103.

Figure 16:
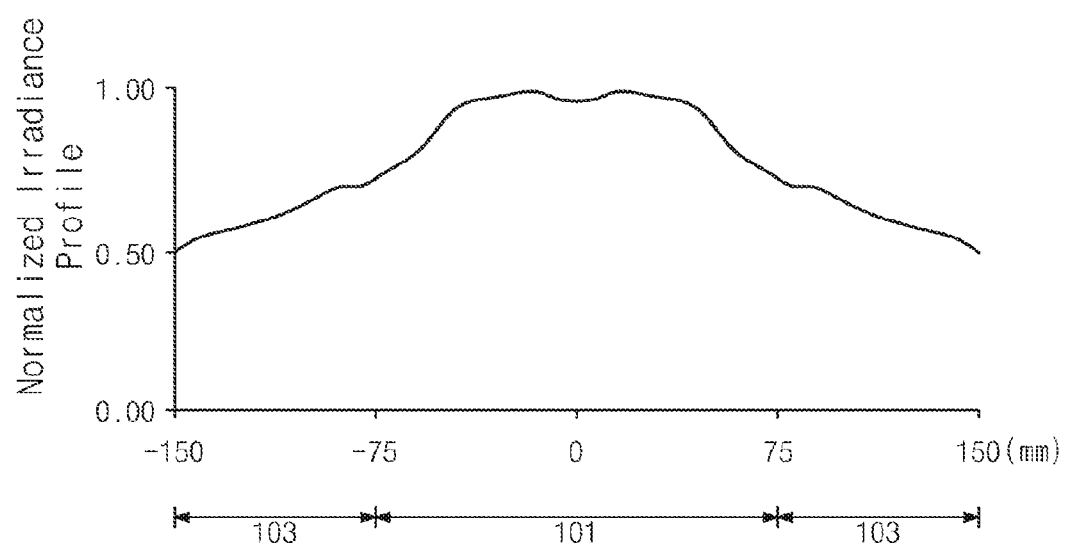
FIG. 16 is a graph showing an irradiance profile of a top light of FIG. 15, according to some embodiments of the inventive concepts.

FIG. 16 is a graph showing an irradiance profile of the top light 120b of FIG. 15, according to some embodiments of the inventive concepts.

Referring to FIG. 16, according to a normalized irradiance profile of the top light 120b, the irradiance of the top light 120b was higher at the center region 101 than at the edge region 103. This is because, by virtue of the upper reflection light 127, the center region 101 may be heated to have a higher temperature than that of the edge region 103. Accordingly, the thin layer 105 on the center region 101 may be thicker than that on the edge region 103.

Figure 17:
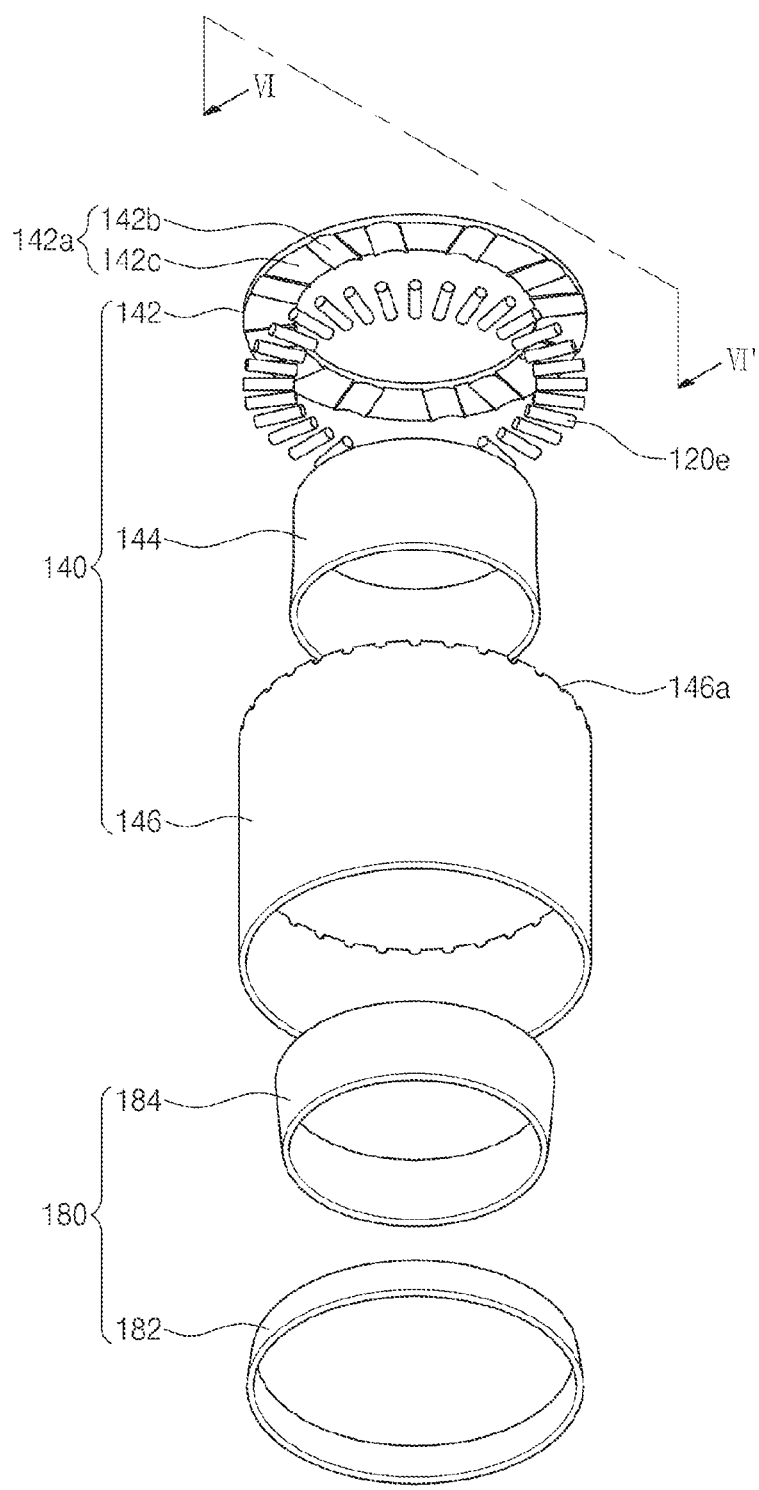
FIG. 17 is an exploded perspective view illustrating an upper reflection control module of FIG. 2, according to some embodiments of the inventive concepts.
Figure 18:
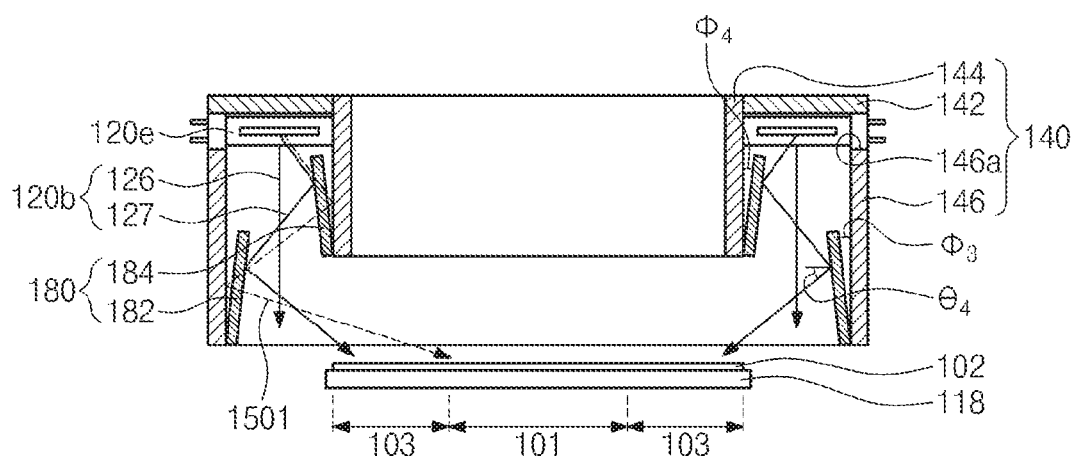
FIG. 18 is a sectional view taken along line VI-VI' of FIG. 17.

FIG. 17 is an exploded perspective view illustrating an upper reflection control module 180 of FIG. 2, according to some embodiments of the inventive concepts, and FIG. 18 is a sectional view taken along line VI-VI' of FIG. 17.

Referring to FIGS. 17 and 18, the upper reflection control module 180 may be disposed between the second inner reflection ring 144 and the second outer reflection ring 146. The upper reflection control module 180 may be configured to reflect the upper reflection light 127 toward the edge region 103, such that at least a portion of the upper reflection light 127 is redirected from propagating along the first trajectory 1501 to propagating along a separate trajectory. For example, as shown in FIG. 18, the elements 182, 184 of the upper reflection control module 180 reflect the upper reflection light 127 which causes the upper reflection light 127 to be redirected from propagating along trajectory 1501 to propagating along a different trajectory. As shown in FIG. 18, the different trajectory, also referred to herein as the second trajectory, is incident upon the edge region 103 of the substrate 102. In some embodiments, the upper reflection control module 180 may be configured to reflect the majority of the upper reflection light 127 at a fourth reflection angle θ4. The fourth reflection angle θ4 may be the same as the second reflection angle θ2. For example, the fourth reflection angle θ4 may range from about 20° to about 30°. In certain embodiments, the upper reflection control module 180 may reflect the upper reflection light 127 within an angle ranging from about 0° to 90°.

The susceptor 118, the third heat sources 120e, the upper direct light 126, and the upper cover reflection ring 142 may be configured to have substantially the same features as those of FIGS. 14 and 15.

The upper reflection control module 180 may include additional upper reflection rings disposed between the second inner reflection ring 144 and the second outer reflection ring 146. In some embodiments, the upper reflection control module 180 may include a second outer reflection control ring 182 and a second inner reflection control ring 184. The second outer reflection control ring 182 may have a diameter greater than that of the second inner reflection control ring 184. The second inner reflection control ring 184 may be positioned at a higher level than that of the second outer reflection control ring 182. The second outer reflection control ring 182 and the second inner reflection control ring 184 may reflect the majority of the upper reflection light 127 at the fourth reflection angle θ4.

The second outer reflection control ring 182 may be provided on an inner sidewall of the second outer reflection ring 146. In some embodiments, the second outer reflection control ring 182 may be fastened to the inner sidewall of the second outer reflection ring 146. A bottom of the second outer reflection control ring 182 may be positioned at the same level as that of the second outer reflection ring 146. The second outer reflection control ring 182 may be shorter than the second outer reflection ring 146. The second outer reflection control ring 182 may be provided in such a way that a distance from the inner sidewall of the second outer reflection ring 146 increases in a direction away from the susceptor 118. For example, the second outer reflection control ring 182 may be provided in such a way that a distance from the second inner reflection ring 144 decreases in the direction away from the susceptor 118. The second outer reflection control ring 182 may be shaped like a truncated hollow cylinder tapering in an upward direction. The second outer reflection control ring 182 may be inclined to have a third inclined angle φ3 ranging from about 0.5° to about 10°. The fourth reflection angle θ4 may be controlled depending on the third inclined angle φ3. For example, the third inclined angle φ3 may be proportional to the fourth reflection angle θ4. The greater the third inclined angle φ3, the greater the fourth reflection angle θ4. This relation may be used to increase an intensity of the upper reflection light 127 propagating toward the edge region 103. The second outer reflection control ring 182 may reflect the majority of the upper reflection light 127, along the second trajectory, toward the edge region 103. In certain embodiments, the second outer reflection control ring 182 may be configured to reflect the upper reflection light 127 toward the center region 101. By using the second outer reflection control ring 182, it is possible to control a spatial variation in temperature of the substrate 102.

The second inner reflection control ring 184 may be provided on an outer sidewall of the second inner reflection ring 144. In some embodiments, the second inner reflection control ring 184 may be fastened to the outer sidewall of the second inner reflection ring 144. A bottom of the second inner reflection control ring 184 may be positioned at the same level as that of the second inner reflection ring 144. The second inner reflection control ring 184 may be shorter than the second inner reflection ring 144. The second inner reflection control ring 184 may be inclined in a direction different from the inclination of the second outer reflection control ring 182. The second inner reflection control ring 184 may be provided in such a way that a distance from the inner sidewall of the second inner reflection ring 144 increases in a direction away from the susceptor 118. For example, the second inner reflection control ring 184 may be provided in such a way that a distance from the second outer reflection ring 146 decreases in a direction away from the susceptor 118. The second inner reflection control ring 184 may be shaped like a truncated hollow cylinder tapering in a downward direction. The second inner reflection control ring 184 may be inclined to have a fourth inclined angle φ4 ranging from about 0.5° to about 10°. The fourth reflection angle θ4 may be controlled depending on the fourth inclined angle φ4. The fourth inclined angle φ4 may be proportional to the fourth reflection angle θ4. For example, the greater the fourth inclined angle φ4, the greater the fourth reflection angle θ4. This relation may be used to increase an intensity of the upper reflection light 127 propagating toward the edge region 103. The second inner reflection control ring 184 may be configured to reflect the upper reflection light 127 toward the second outer reflection control ring 182 to cause the light 127 to propagate along a second trajectory which reflects off of the second outer reflection control ring 182 and is incident upon the edge region 103 of the substrate 102. Accordingly, by using the second inner reflection control ring 184, it is possible to control a spatial variation in temperature of the substrate 102.

Figure 19:
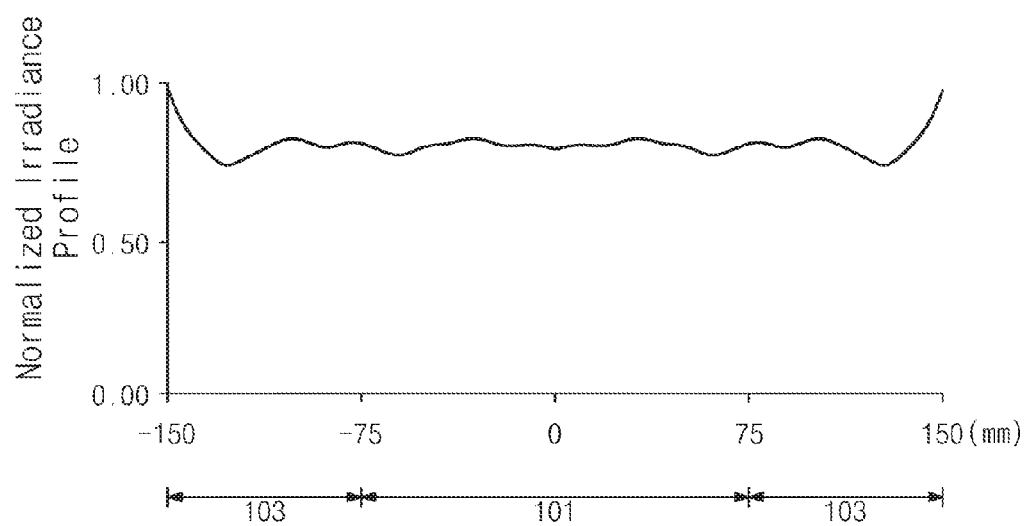
FIG. 19 is a graph showing an irradiance profile of top light of FIG. 18, according to some embodiments of the inventive concepts.

FIG. 19 is a graph showing an irradiance profile of the top light 120b of FIG. 18 according to some embodiments of the inventive concepts.

Referring to FIG. 19, according to a normalized irradiance profile of the top light 120b, the irradiance of the top light 120b was higher at the edge region 103 than at the center region 101. As a result, the edge region 103 may be heated to have a higher temperature than that of the center region 101. The thin layer 105 on the edge region 103 may be formed thicker than that of the center region 101. In certain embodiments, the irradiances at the center and edge regions 101 and 103 may be substantially equal to each other. As a result, the substrate 102 may be heated to have substantially the same temperature at the center and edge regions 101 and 103. Furthermore, the substantially equalized irradiances at the center and edge regions 101 and 103, also referred to herein as a substantially uniform irradiance of the substrate, may result in a reduced difference in thickness of the thin layer 105 between the center and edge regions 101 and 103, and thus may result in improved thin layer 105 thickness uniformity.

Figure 20:
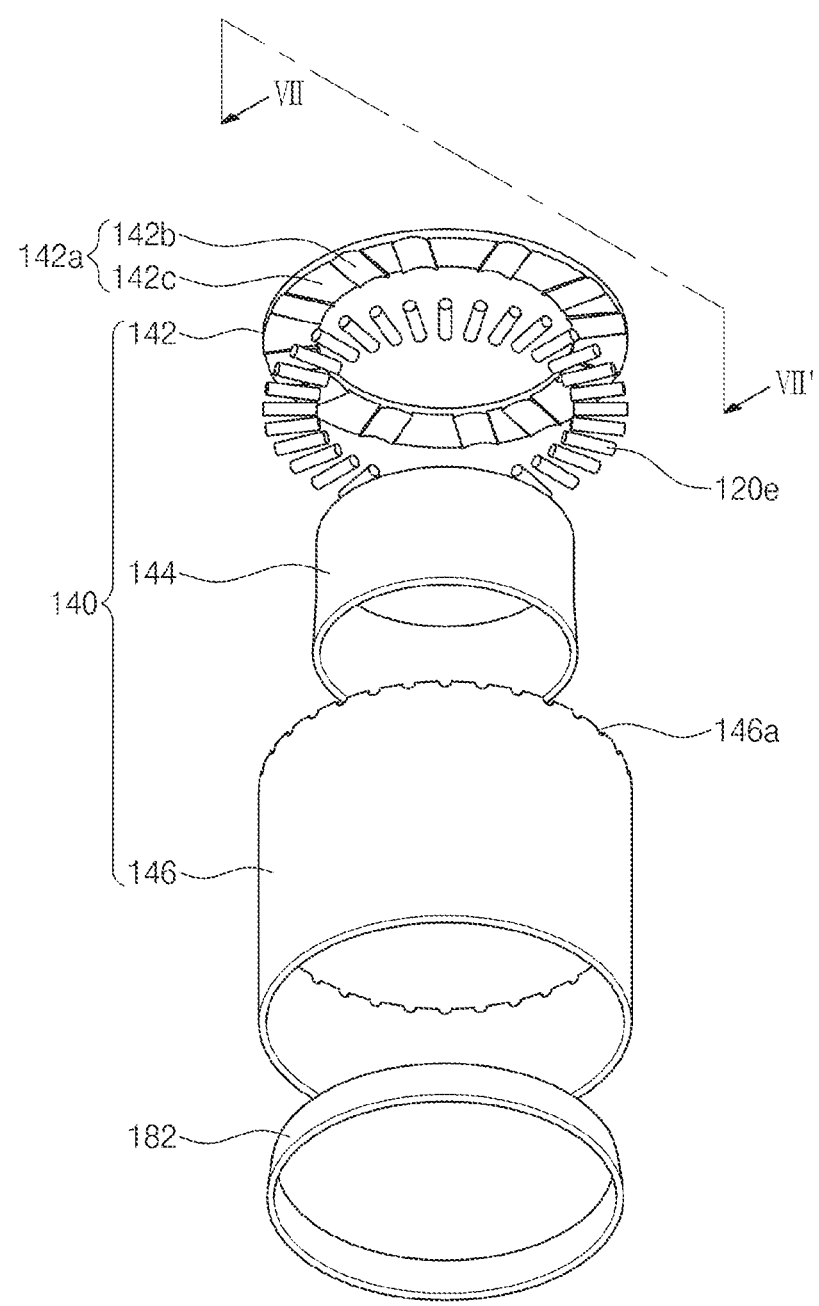
FIG. 20 is an exploded perspective view illustrating an upper reflection control module of FIG. 18, according to some embodiments of the inventive concepts.
Figure 21:
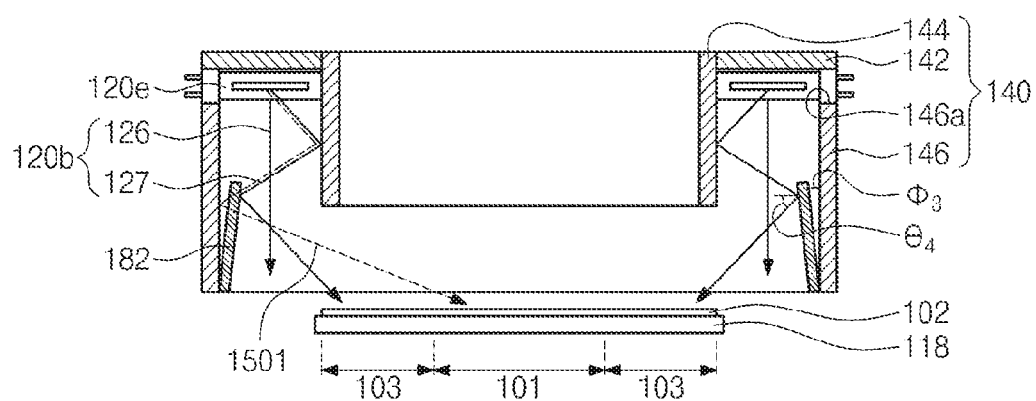
FIG. 21 is a sectional view taken along line VII-VII' of FIG. 20.

FIG. 20 is an exploded perspective view illustrating an upper reflection control module 180 of FIG. 18, according to some embodiments of the inventive concepts, and FIG. 21 is a sectional view taken along line VII-VII' of FIG. 20.

Referring to FIGS. 20 and 21, the second outer reflection control ring 182 may be configured to reflect the upper reflection light 127 to cause the light 127 to be redirected, from propagating along a first trajectory 1501, to propagating along a second trajectory which is incident on the edge region 103 of the substrate 102, as shown in at least FIG. 21. The upper reflection light 127 may be emitted from the third heat sources 120e and may be incident on the second inner reflection ring 144. The second inner reflection ring 144 may reflect the upper reflection light 127, along the illustrated second trajectory, toward the second outer reflection control ring 182. The second outer reflection control ring 182 may be configured to allow the upper reflection light 127 propagating toward the edge region 103 to have the third reflection angle θ3.

The susceptor 118, the third heat sources 120e, the upper direct light 126, and the upper cover reflection ring 142 may be configured to have substantially the same features as those of FIGS. 14 and 15. In the present embodiments, the second inner reflection control ring 184 of FIGS. 14 and 15 may not be provided.

Figure 22:
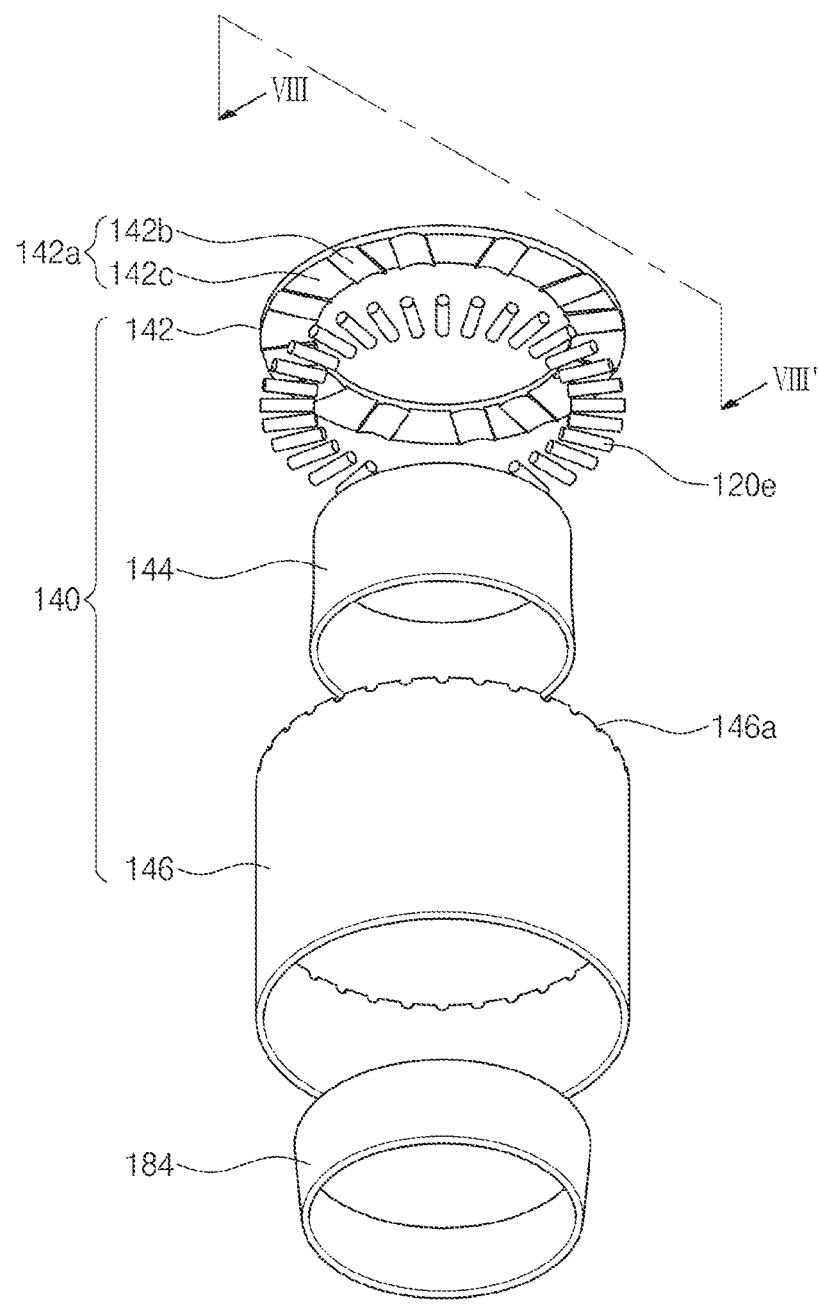
FIG. 22 is an exploded perspective view illustrating an upper reflection control module of FIG. 18, according to some embodiments of the inventive concepts.
Figure 23:
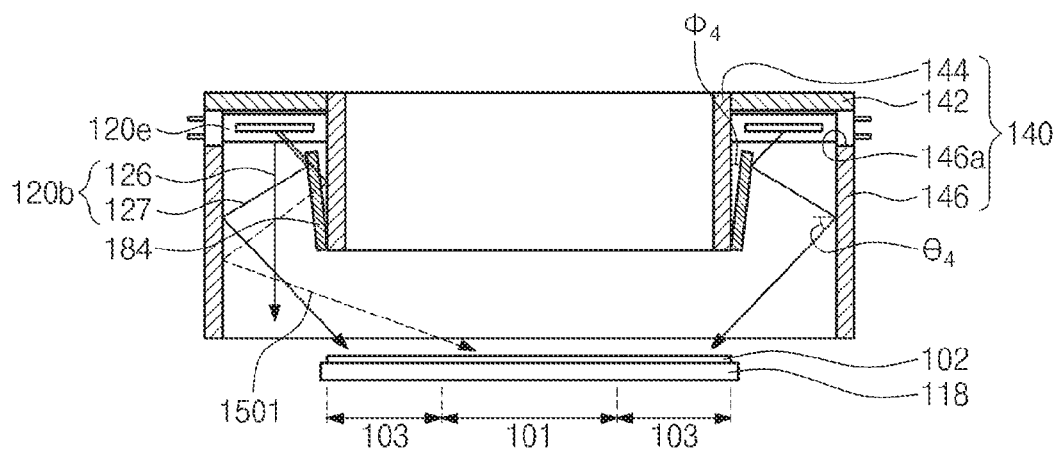
FIG. 23 is a sectional view taken along line VIII-VIII' of FIG. 22.

FIG. 22 is an exploded perspective view illustrating an upper reflection control module 180 of FIG. 18, according to some embodiments of the inventive concepts, and FIG. 23 is a sectional view taken along line VIII-VIII' of FIG. 22.

Referring to FIGS. 22 and 23, the second inner reflection control ring 184 and the second outer reflection ring 146 may be configured to reflect the upper reflection light 127 to cause the light 125 to be redirected, from propagating along a first trajectory 401, to propagating along a second trajectory which is incident on the edge region 103 of the substrate 102, as shown in at least FIG. 23. The upper reflection light 127 may be emitted from the third heat sources 120e provided below the upper cover reflection ring 142 and may be incident on the second inner reflection control ring 184. The second inner reflection control ring 184 may reflect the upper reflection light 127, along the illustrated second trajectory, toward the second outer reflection ring 146. The second outer reflection ring 146 may reflect the upper reflection light 127, along the illustrated second trajectory, toward the edge region 103. The second inner reflection control ring 184 and the second outer reflection ring 146 may be configured to reflect the upper reflection light 127 at the third reflection angle θ3.

The susceptor 118, the third heat sources 120e, the upper direct light 126, and the upper cover reflection ring 142 may be configured to have substantially the same features as those of FIGS. 14 and 15. In the present embodiments, the second outer reflection control ring 182 of FIGS. 14 and 15 may not be provided.

As described above, according to some embodiments of the inventive concepts, a deposition system may include a reflection control module reflecting a fraction of light, which propagates toward a center region of a substrate by a reflection housing of a heating module, toward an edge region of the substrate. The use of the reflection control module makes it possible for the center and edge regions of the substrate to be heated up to a uniform temperature. Furthermore, this makes it possible for a thin layer to have a uniform thickness on the substrate. Uniform thin layer thickness may result in improved reliability of the thin layer, performance of the thin layer, some combination thereof, etc. relative to a thin layer which includes a non-uniform thickness.

While some embodiments of the inventive concepts have been particularly shown and described, it will be understood by one of ordinary skill in the art that variations in form and detail may be made therein without departing from the spirit and scope of the attached claims.

What is claimed is:

1. A deposition system, comprising:
a chamber;
a susceptor in the chamber, the susceptor configured to hold a substrate in the chamber;
a reflection housing outside the chamber, the reflection housing including:
an outer reflection ring, and
an inner reflection ring in the outer reflection ring, the inner reflection ring parallel to the outer reflection ring;
at least one light source in the reflection housing, such that the outer reflection ring and the inner reflection ring are configured to reflect light emitted by the at least one light source toward each other; and
a reflection control module in the reflection housing, the reflection control module between the at least one light source and the chamber, the reflection control module including at least one reflection control ring that is fastened to a reflective sidewall of the outer reflection ring or a reflective sidewall of the inner reflection ring such that
the at least one reflection control ring at least partially covers the reflective sidewall to which the at least one reflection control ring is fastened, and
the reflection control module is configured to reflect light generated at the at least one light source, such that the reflected light is redirected, from propagating along a pathway which is incident upon a first region of the susceptor configured to hold a center region of the substrate, to propagate along a separate pathway which is incident upon a separate region of the susceptor configured to hold an edge region of the substrate.

2. The deposition system of claim 1, wherein,
the reflection housing includes a lower reflection housing below the susceptor, the outer reflection ring includes a first outer reflection ring below the susceptor, and the inner reflection ring includes a first inner reflection ring in the first outer reflection ring, and
the reflection control module includes a lower reflection control module between the first inner reflection ring and the first outer reflection ring.

3. The deposition system of claim 2, wherein the at least one reflection control ring includes a first outer reflection control ring that is fastened to an inner sidewall of the first outer reflection ring and has a first inclined angle with respect to the inner sidewall of the first outer reflection ring.

4. The deposition system of claim 2, wherein,
the at least one reflection control ring includes a first inner reflection control ring fastened to an outer sidewall of the first inner reflection ring and having a second inclined angle with respect to the outer sidewall of the first inner reflection ring.

5. The deposition system of claim 4, wherein,
the lower reflection housing further includes an inner cover reflection ring in the first inner reflection ring and below the at least one light source, and
the inner cover reflection ring includes first semi-cylindrical reflection concaves corresponding to the at least one light source.

6. The deposition system of claim 4, wherein,
the lower reflection housing further includes an outer cover reflection ring between the first outer reflection ring and the first inner reflection ring and below the at least one light source, and
the outer cover reflection ring includes second semi-cylindrical reflection concaves corresponding to the at least one light source.

7. The deposition system of claim 1, wherein,
the reflection housing includes an upper reflection housing on the susceptor, the inner reflection ring includes a second inner reflection ring on the susceptor, and the outer reflection ring includes a second outer reflection ring outside the second inner reflection ring, and
the reflection control module includes an upper reflection control module between the second inner reflection ring and the second outer reflection ring.

8. The deposition system of claim 7, wherein the at least one reflection control ring includes a second outer reflection control ring that is fastened to an inner sidewall of the second outer reflection ring and has a third inclined angle with respect to the inner sidewall of the second outer reflection ring.

9. The deposition system of claim 7, wherein the at least one reflection control ring includes a second inner reflection control ring that is fastened to an outer sidewall of the second inner reflection ring and has a fourth inclined angle with respect to the outer sidewall of the second inner reflection ring.

10. A deposition system, comprising:
a susceptor configured to hold a substrate;
a lower reflection housing below the susceptor, the lower reflection housing including a lower outer reflection ring and a lower inner reflection ring, the lower inner reflection ring parallel to the lower outer reflection ring;

an upper reflection housing on the susceptor, the upper reflection housing including an upper outer reflection ring and an upper inner reflection ring, the upper inner reflection ring parallel to the upper outer reflection ring;

at least one lower light source and at least one upper light source, which are in the lower reflection housing and the upper reflection housing, respectively, such that the lower outer reflection ring and the lower inner reflection ring are configured to reflect light emitted by the at least one lower light source toward each other, and the upper outer reflection ring and the upper inner reflection ring are configured to reflect light emitted by the at least one upper light source toward each other; and a reflection control module including:

a lower reflection control module, which is in the lower reflection housing between the susceptor and the at least one lower light source, the lower reflection control module including at least one lower reflection control ring that is fastened to a reflective sidewall of the lower outer reflection ring or a reflective sidewall of the lower inner reflection ring such that the at least one lower reflection control ring at least partially covers the reflective sidewall to which the at least one lower reflection control ring is fastened, and an upper reflection control module in the upper reflection housing between the susceptor and the at least one upper light source, the upper reflection control module including at least one upper reflection control ring that is fastened to a reflective sidewall of the upper outer reflection ring or a reflective sidewall of the upper inner reflection ring such that the at least one upper reflection control ring at least partially covers the reflective sidewall to which the at least one upper reflection control ring is fastened.

11. The deposition system of claim 10, wherein the at least one lower reflection control ring includes a first outer reflection control ring, the first outer reflection control ring is fastened to an inner sidewall of the first outer reflection ring, the first outer reflection control ring includes a first inclined angle with respect to the inner sidewall of the first outer reflection ring.

12. The deposition system of claim 10, wherein the at least one lower reflection control ring includes a first inner reflection control ring, the first inner reflection control ring is fastened to an outer sidewall of the lower inner reflection ring, the first inner reflection control ring includes a second inclined angle with respect to the outer sidewall of the lower inner reflection ring.

13. The deposition system of claim 10, wherein the at least one upper reflection control ring includes a second outer reflection control ring, the second outer reflection control ring is fastened to an inner sidewall of the second outer reflection ring, the second outer reflection control ring includes a third inclined angle with respect to the inner sidewall of the second outer reflection ring.

14. The deposition system of claim 10, wherein the at least one upper reflection control ring includes a second inner reflection control ring, the second inner reflection control ring is fastened to an outer sidewall of the second inner reflection ring, the second inner reflection control ring includes a fourth inclined angle with respect to the outer sidewall of the second inner reflection ring.

15. An apparatus, comprising:

at least one reflection control module in a reflection housing between at least one light source and at least one substrate in a deposition system, the reflection housing including an outer reflection ring and an inner reflection ring in the outer reflection ring, the inner reflection ring parallel to the outer reflection ring, the outer reflection ring and the inner reflection ring configured to reflect light emitted by the at least one light source toward each other, the at least one reflection control module including at least one reflection control ring that is fastened to a reflective sidewall of the outer reflection ring or a reflective sidewall of the inner reflection ring, such that the at least one reflection control ring at least partially covers the reflective sidewall to which the at least one reflection control ring is fastened; and the at least one reflection control module further configured to reflect light propagating from the at least one light source, such that the reflected light is redirected from propagating along a first trajectory to propagating along a second trajectory, wherein, the first trajectory is incident upon a center region of the substrate, and the second trajectory is incident upon an edge region of the substrate.

16. The apparatus of claim 15, wherein, the reflection housing is disposed on at least one side of a susceptor, the susceptor is configured to hold the at least one substrate.

17. The apparatus of claim 16, wherein, the reflection housing includes a lower reflection housing below the susceptor, the outer reflection ring includes a first outer reflection ring below the susceptor, and the inner reflection ring includes a first inner reflection ring in the first outer reflection ring;

the reflection control module includes a lower reflection control module between the first inner reflection ring and the first outer reflection ring; and the at least one reflection control ring includes a first outer reflection control ring, the first outer reflection control ring is configured to be fastened to an inner sidewall of the first outer reflection ring, such that the first outer reflection control ring is inclined at a first inclined angle with respect to the inner sidewall of the first outer reflection ring.

18. The apparatus of claim 16, wherein, the reflection housing includes an upper reflection housing on the susceptor, the inner reflection ring includes a second inner reflection ring above the susceptor, and the outer reflection ring includes a second outer reflection ring outside the second inner reflection ring;

the reflection control module includes an upper reflection control module between the second inner reflection ring and the second outer reflection ring; and the at least one reflection control ring includes a second outer reflection control ring, the second outer reflection control ring is configured to be fastened to an inner sidewall of the second outer reflection ring, such that the second outer reflection control ring is inclined at a second inclined angle with respect to the inner sidewall of the second outer reflection ring.

* * * * *